United States Patent
Kim et al.

(10) Patent No.: US 10,873,215 B2
(45) Date of Patent: Dec. 22, 2020

(54) RESONANT REGULATING RECTIFIER WITH AN INTEGRATED ANTENNA

(71) Applicant: The Regents Of The University Of California, Oakland, CA (US)

(72) Inventors: Chul Kim, La Jolla, CA (US); Gert Cauwenberghs, San Diego, CA (US); Patrick P. Mercier, San Diego, CA (US); Sohmyung Ha, La Jolla, CA (US); Jiwoong Park, La Jolla, CA (US); Abraham Akinin, La Jolla, CA (US)

(73) Assignee: The Regents of the University of California, Oakland, CA (US)

( * ) Notice: Subject to any disclaimer, the term of this patent is extended or adjusted under 35 U.S.C. 154(b) by 348 days.

(21) Appl. No.: 15/736,239

(22) PCT Filed: Jun. 15, 2016

(86) PCT No.: PCT/US2016/037706
§ 371 (c)(1),
(2) Date: Dec. 13, 2017

(87) PCT Pub. No.: WO2016/205426
PCT Pub. Date: Dec. 22, 2016

(65) Prior Publication Data
US 2018/0191199 A1      Jul. 5, 2018

Related U.S. Application Data

(60) Provisional application No. 62/175,945, filed on Jun. 15, 2015.

(51) Int. Cl.
*H02J 50/12*      (2016.01)
*H02M 3/156*      (2006.01)
(Continued)

(52) U.S. Cl.
CPC .............. *H02J 50/12* (2016.02); *H02J 5/005* (2013.01); *H02M 3/156* (2013.01); *H02M 3/335* (2013.01);
(Continued)

(58) Field of Classification Search
CPC ........ H02J 50/12; H02J 5/005; H03B 5/1228; H03B 5/1212; H03B 5/1206; H03B 27/00;
(Continued)

(56) References Cited

U.S. PATENT DOCUMENTS

| 2,856,526 A | 10/1958 | Merrill |
| 3,643,112 A | 2/1972 | Perrin |

(Continued)

OTHER PUBLICATIONS

Choi, Jun-Han, et al. "A resonant regulating rectifier (3R) operating at 6.78 MHz for a 6W wireless charger with 86% efficiency." Solid-State Circuits Conference Digest of Technical Papers (ISSCC), 2013 IEEE International. IEEE, 2013.
(Continued)

*Primary Examiner* — Rexford N Barnie
*Assistant Examiner* — Thai H Tran
(74) *Attorney, Agent, or Firm* — Mintz Levin Cohn Ferris Glovsky and Popeo, P.C.

(57) ABSTRACT

An apparatus for wireless power transfer is described. In some implementations, the apparatus includes a resonant circuit configured to receive a radio frequency input and generate an in-phase voltage and an out-of-phase voltage. The apparatus further includes a pulse generation circuit configured to at least gate the in-phase voltage to provide a first output voltage, and gate the out-of-phase voltage to provide a second output voltage. The apparatus further includes a pulse width modulation circuit configured to provide, to the pulse generating circuit, information for
(Continued)

controlling the pulse width modulation setting. The apparatus further includes a pulse frequency modulation circuit configured to provide, to the pulse generating circuit, information for controlling the pulse frequency modulation setting, the information for controlling the pulse frequency modulation setting determined based on the pulse width modulation setting. Related systems, methods, and articles of manufacture are also described.

20 Claims, 14 Drawing Sheets

(51) Int. Cl.
　　H02M 3/335　　(2006.01)
　　H03B 27/00　　(2006.01)
　　H03B 5/12　　(2006.01)
　　H02J 5/00　　(2016.01)
　　H02M 7/217　　(2006.01)
(52) U.S. Cl.
　　CPC .......... H02M 7/217 (2013.01); H03B 5/1206 (2013.01); H03B 5/1212 (2013.01); H03B 5/1228 (2013.01); H03B 27/00 (2013.01); *Y02B 70/10* (2013.01)
(58) Field of Classification Search
　　CPC ...... H02M 7/217; H02M 3/156; H02M 3/335; Y02B 70/1441

USPC .......................................... 307/104; 320/108
See application file for complete search history.

(56) References Cited

U.S. PATENT DOCUMENTS

| | | | |
|---|---|---|---|
| 4,767,912 A | 8/1988 | Eldridge | |
| 5,908,444 A | 6/1999 | Azure | |
| 8,077,803 B2 | 12/2011 | Hausmann et al. | |
| 2006/0284609 A1* | 12/2006 | Weng | H02M 3/156 |
| | | | 323/286 |
| 2008/0079504 A1 | 4/2008 | Byun et al. | |
| 2009/0245420 A1 | 10/2009 | Hausmann et al. | |
| 2014/0036544 A1 | 2/2014 | Bavel | |
| 2014/0092659 A1 | 4/2014 | Lin et al. | |
| 2015/0035511 A1 | 2/2015 | Mei | |
| 2015/0326255 A1 | 11/2015 | Dally | |
| 2017/0070082 A1* | 3/2017 | Zheng | H02M 3/156 |

OTHER PUBLICATIONS

Lee, Hyung-Min, and Maysam Ghovanloo. "An adaptive reconfigurable active voltage doubler/rectifier for extended-range inductive power transmission." IEEE Transactions on Circuits and Systems II: Express Briefs 59.8 (2012): 481-485.

Muller, Rikky, et al. "A minimally invasive 64-channel wireless μECoG implant." IEEE Journal of Solid-State Circuits 50.1 (2015): 344-359.

* cited by examiner

H-Tree distribution: • No loops
• Equidistant paths

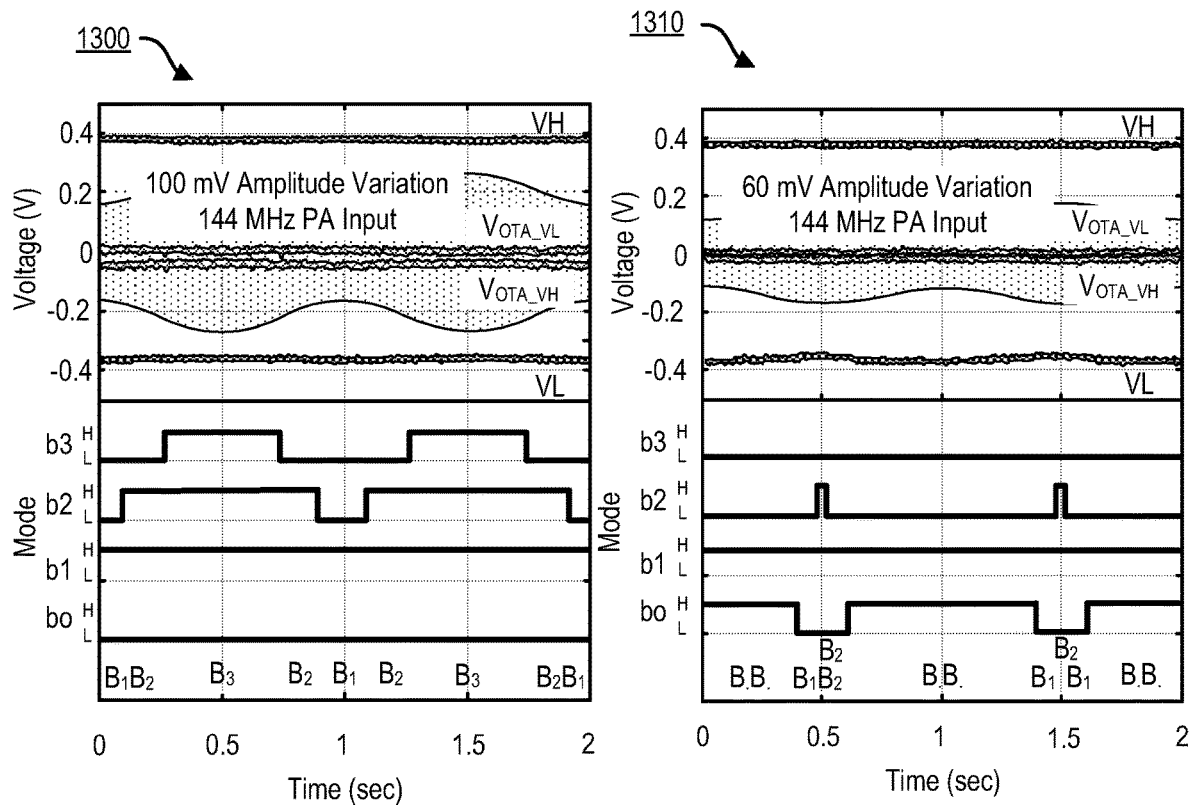
FIG. 15A
FIG. 15B
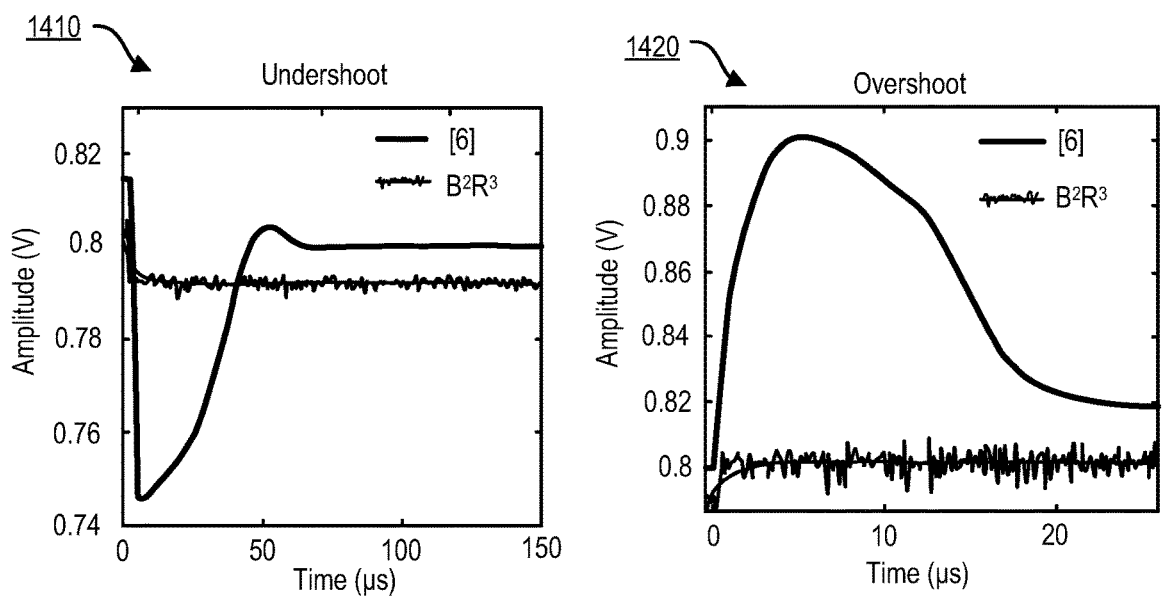
FIG. 16A
FIG. 16B

1700

1710
RECEIVE A RADIO FREQUENCY INPUT FROM A WIRELESS POWER TRANSMITTER

1720
GENERATE AN IN-PHASE VOLTAGE AND AN OUT-OF-PHASE VOLTAGE

1730
GATE THE IN-PHASE VOLTAGE TO PROVIDE A FIRST OUTPUT VOLTAGE

1740
GATE THE OUT-OF-PHASE VOLTAGE TO PROVIDE A SECOND OUTPUT VOLTAGE

1750
PROVIDE INFORMATION FOR CONTROLLING A PULSE WIDTH MODULATION SETTING

1760
PROVIDE INFORMATION FOR CONTROLLING A PULSE FREQUENCY MODULATION SETTING, BASED ON THE PULSE WIDTH MODULATION SETTING

FIG. 17

RESONANT REGULATING RECTIFIER WITH AN INTEGRATED ANTENNA

CROSS REFERENCE TO RELATED APPLICATIONS

This application is a national-phase entry of Patent Cooperation Treaty Application No. PCT/US2016/037706 filed Jun. 15, 2016, entitled "RESONANT REGULATING RECTIFIER WITH AN INTEGRATED ANTENNA," which claims the benefit of priority to U.S. Provisional Patent Application No. 62/175,945 filed Jun. 15, 2015, entitled "RESONANT REGULATING RECTIFIER WITH INTEGRATED RF ANTENNA," the contents of which are hereby incorporated by reference in their entirety.

TECHNICAL FIELD

The subject matter described herein relates to wireless power transfer, and more specifically to resonant regulating rectifier with an integrated antenna.

BACKGROUND

Transcutaneous wireless power transfer links are often used to power implantable devices due to their completely wireless operation. However, as some wireless power transfer techniques operate at 13.56 MHz or lower, a bulky external resonator may be required in order to receive power wirelessly. Additionally, the received power may need to be rectified before it is used to power/charge the device. Further, compliance with wireless power transfer standards and commercial product laws can require that the supply voltage be regulated and/or stabilized. However, due to varying performance in power conversion efficiency, the total efficiency of the rectifier and regulator can depend on the radio frequency (RF) input voltage. Accordingly, spatially efficient and power efficient circuits for powering implantable devices may be desirable.

SUMMARY

A resonant regulating rectifier for wireless power transfer is described. In some implementations, the apparatus comprises a resonant circuit configured to receive a radio frequency input from a wireless power transmitter and generate an in-phase voltage and an out-of-phase voltage. The apparatus further comprises a pulse generation circuit coupled to the resonant circuit, the pulse generator circuit configured to at least gate the in-phase voltage to provide a first output voltage, and gate the out-of-phase voltage to provide a second output voltage, the gating of the in-phase voltage and the gating of the out-of-phase voltage controlled by a pulse width modulation setting and a pulse frequency modulation setting. The apparatus comprises a pulse width modulation circuit configured to provide, to the pulse generating circuit, information for controlling the pulse width modulation setting. The apparatus comprises a pulse frequency modulation circuit configured to provide, to the pulse generating circuit, information for controlling the pulse frequency modulation setting, the information for controlling the pulse frequency modulation setting determined based on the pulse width modulation setting.

In some implementations, the above-noted aspects may further include features described herein, including one or more of the following: the pulse generation circuit comprises a first transistor operatively coupled to the in-phase voltage and a second transistor operatively coupled to the out-phase voltage; the pulse generation circuit operates the first transistor based at least in part upon the pulse width modulation setting, the pulse frequency modulation setting, and the in-phase voltage; the pulse generation circuit operates the second transistor based at least in part upon the pulse width modulation setting, the pulse frequency modulation setting, and the out-phase voltage; the pulse width modulation circuit comprises an amplifier circuit, the amplifier compares a voltage divided result of the first output voltage or the second output voltage against a reference voltage to generate an analog control signal, and/or the information for controlling the pulse width modulation setting comprises the analog control; the first output voltage and the second output voltage occur sequentially in time; the first output voltage and the second output voltage enable providing a source of power; the first output voltage and the second output voltage comprise a low-voltage direct current that is regulated; the pulse frequency modulation circuit comprises a clock generation circuit for providing the information for controlling the pulse frequency modulation as a digital signal; the pulse frequency modulation circuit comprises a bidirectional shift register for controlling a clock generation circuit; the pulse frequency modulation circuit comprises a first latch circuit for determining whether the pulse width modulation setting is at an upper threshold; the pulse frequency modulation circuit comprises a second latch circuit for determining whether the pulse width modulation setting is at a lower threshold; the pulse frequency modulation circuit further comprises a latch enabler circuit to selectively enable latch circuits; the pulse generation circuit comprises a comparator for comparing the in-phase voltage against the first output voltage or the second output voltage to generate a first signal for turning the pulse generation circuit on; the pulse generation circuit further comprises a latch circuit for comparing the first output voltage or the second output voltage against a ground signal to generate a second signal for turning the pulse generation circuit off; the apparatus comprises a chip; the resonant circuit comprises a loop coil antenna on a chip; a majority of wires on a chip other than an antenna do not form loops; the apparatus comprises a mode arbiter which controls a current mode of a buck-boost circuit; a buck-boost circuit regulates and rectifies the radio frequency input; current modes of a buck-boost circuit comprise a boost mode, a buck mode, and a combined boost-buck mode; the apparatus comprises a feedback circuit for controlling a boost circuit; a feedback circuit modifies at least a portion of the first output voltage or the second output voltage through operational transconductance amplification and/or proportional integral derivative to generate a control signal for turning a boost circuit and/or a buck circuit off and on.

Non-transitory computer program products (i.e., physically embodied computer program products) are also described that store instructions, which when executed by one or more data processors of one or more computing systems, causes at least one data processor to perform operations herein. Similarly, computer systems are also described that may include one or more data processors and one or more memory circuits coupled to the one or more data processors. The one or more memory circuits may temporarily or permanently store instructions that cause at least one processor to perform one or more of the operations described herein. In addition, methods can be implemented by one or more data processors either within a single computing system or distributed among two or more computing systems. Such computing systems may be connected and may exchange data and/or commands or other instructions or the like via one or more connections, including but not limited to a connection over a network (e.g. the Internet, a wireless wide area network, a local area network, a wide area network, a wired network, or the like), via a direct connection between one or more of the multiple computing systems, etc.

The details of one or more variations of the subject matter described herein are set forth in the accompanying drawings and the description below. Other features and advantages of the subject matter described herein will be apparent from the description and drawings, and from the claims.

DESCRIPTION OF THE DRAWINGS

The accompanying drawings, which are incorporated in and constitute a part of this specification, show certain aspects of the subject matter disclosed herein and, together with the description, help explain some of the principles associated with the subject matter disclosed herein. In the drawings.

FIG. 15A depicts an example voltage and buck-boost mode diagram;

FIG. 15B depicts another example voltage and buck-boost mode diagram;

FIG. 16A depicts example undershoot data;

FIG. 16B depicts example overshoot data; and

FIG. 17 illustrates a method of providing wireless power.

Like reference symbols in the various drawings indicate like elements.

DETAILED DESCRIPTION

Transcutaneous wireless power transfer links are often used to power implantable devices due to their completely wireless operation. Transcutaneous operations can utilize mm-sized implants requiring a few tens or hundreds of microwatts. However, less than 10% efficiency can be achieved when driving loads below 10 mW, which may be typical in implantable applications, and a large external coil may thus be required. Further, wireless power transfer techniques can operate at 13.56 MHz or lower, requiring a bulky external resonator. The bulky external resonator, in addition to taking up more space, can require lead lines between the resonator and the rest of the implantable device. These lead lines can cause health-related issues in transcutaneous scenarios.

Figure 1A:
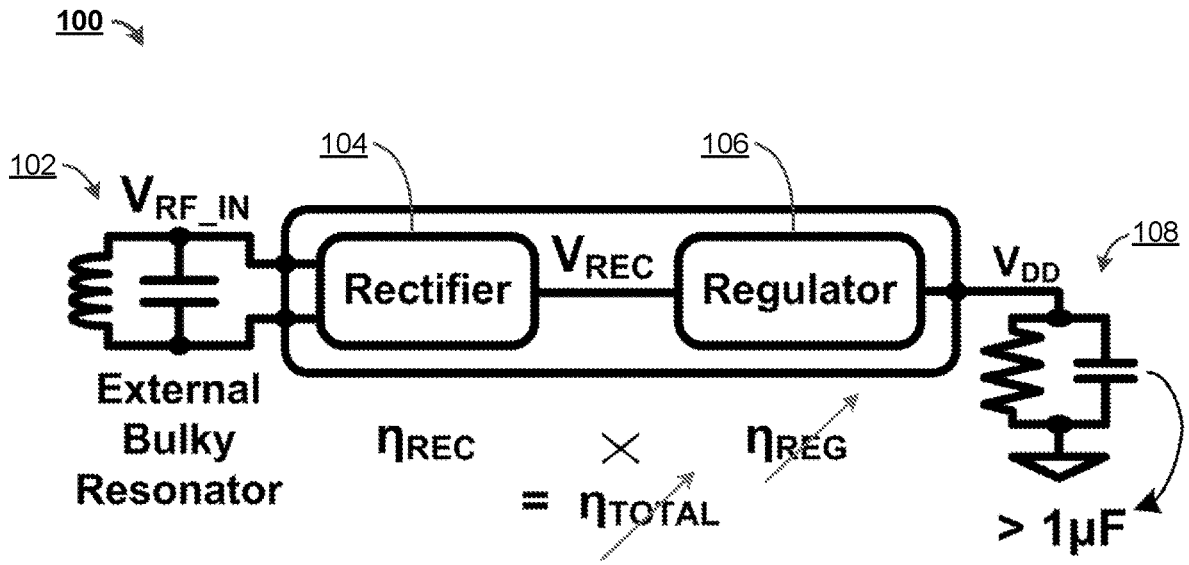
FIG. 1A depicts an example of a regulating rectifier with an external resonator.

For example, FIG. 1A depicts an example of a regulating rectifier 100 with an external resonator 102. As illustrated, the regulating rectifier 100 includes a rectifier 104 in series with a regulator 106. In some aspects, the external resonator 102 receives wireless power from an external wireless power transmitter (not shown), and provides a received voltage $V_{RF\_IN}$ to the rectifier 104. In some aspects, the resonator 102 is designed to receive a low frequency signal (e.g., less than 10 MHz and/or around 6.78 MHz), and may therefore require a large resonator and/or capacitor to receive power wirelessly. These size restrictions may therefore require the resonator 102 to be external to certain smaller sized chips, for example. The rectifier 104 can rectify the received voltage $V_{RF\_IN}$ to form a rectified voltage $V_{REC}$, which can be provided to the regulator 106. The regulator 106 may then regulate the rectified voltage $V_{REC}$ to form an output voltage $V_{DD}$, which is provided to a load 108. In some aspects, a low drop out (LDO) regulator can be employed to stabilize the supply voltage. However, due to varying LDO performance in power conversion efficiency, the total efficiency of the rectifier 104 and regulator 106 depends on the RF input voltage. Thus, although the output voltage $V_{DD}$ is both rectified and regulated, inefficiencies can result when rectification and regulation are performed sequentially, as opposed to being performed at the same or substantially the same time. To eliminate the need for an LDO altogether, a regulating rectifier may be used.

Figure 1B:
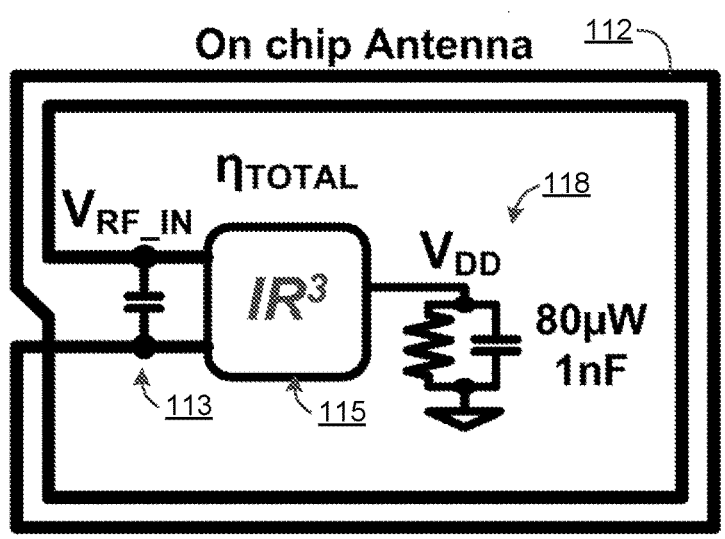
FIG. 1B depicts an example of an integrated resonant regulating rectifier.

FIG. 1B depicts an example of an integrated resonant regulating rectifier 110 (illustrated as $IR^3$). The integrated resonant regulating rectifier 110 may offer spatially efficient and power efficient operations. As illustrated, the integrated resonant regulating rectifier 110 includes an on chip antenna 112, a capacitor 113, a resonant regulating rectifier 115, and a load 118. In various implementations, the on chip antenna 112 receives wireless power from a wireless power transmitter (not shown) and provides an input voltage $V_{RF\_IN}$ through the capacitor 113 to the resonant regulating rectifier 115. In some aspects, the antenna and/or the capacitor 113 may be used to generate an in-phase and an out-of-phase signal, based on the received RF signal. In some implementations, the received RF signal may be around 144 MHz, which may allow for greater wireless power transfer. This configuration of the integrated resonant regulating rectifier 110 can provide additional efficiencies in wireless power transfer over the regulating rectifier 100 with an external resonator 102 of FIG. 1A.

The resonant regulating rectifier 115 may provide at least a constant DC voltage power $V_{DD}$ from variable RF power $V_{RF\_IN}$ obtained from the on-chip antenna 112 including an inductive coil and shunt capacitor 113 at resonance. For high efficiency across various load conditions, rectification and regulation may performed simultaneously and directly coupled to the integrated resonator by way of a hybrid modulation scheme. This hybrid modulation may combine pulse width modulation (PWM) and pulse frequency modulation (PFM).

Figure 1C:
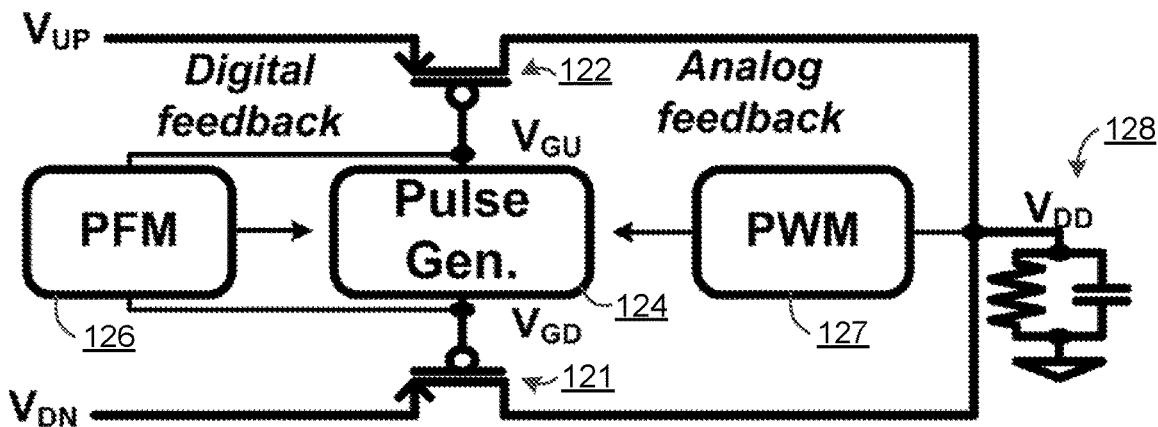
FIG. 1C depicts an example of a portion of an integrated resonant regulating rectifier.

For example, FIG. 1C depicts an example of a circuit 120 forming a portion of an integrated resonant regulating rectifier. For example, the illustrated circuit 120 may be a portion of the integrated resonant regulating rectifier 110 of FIG. 1B. As illustrated, the circuit 120 includes inputs $V_{UP}$ and $V_{DN}$, which may be the in-phase and out-of-phase voltage of the input voltage $V_{RF\_IN}$. In some aspects, VUP and/or VDN may be half-wave signals, as opposed to full sin waves. As illustrated, $V_{UP}$ and $V_{DN}$ can be controlled through a pulse generator 124 such that they may be provided (in whole or in part) as the output voltage $V_{DD}$ to the load 128. Specifically, $V_{UP}$ can be controlled through the pulse generator 124 via transistor 122, and/or $V_{DN}$ can be controlled through the pulse generator 124 via transistor 121. In some aspects, the transistors 121, 122 may be implemented as field-effect transistors, and/or may operate according to PMOS logic.

In various implementations, $V_{GU}$ can control the switching of transistor 122 and/or $V_{GD}$ can control the switching of transistor 121. To regulate the RF input to generate the $V_{DD}$, as illustrated, the circuit 120 can further comprise a pulse frequency modulation circuit 126 and a pulse width modulation circuit 127. In some aspects, the pulse frequency modulation circuit 126 can provide digital feedback for the control of the pulse generator 124. Digital feedback may be faster, and may therefore be utilized for coarse regulation of the RF input to generate the output voltage $V_{DD}$. Similarly, the pulse width modulation circuit 127 can provide analog feedback for the control of the pulse generator 124. Analog feedback may be slower, and may therefore be utilized for fine regulation of the RF input to generate the output voltage $V_{DD}$. The configuration of simultaneous (or substantially simultaneous) pulse frequency modulation and pulse width modulation of an input voltage can provide additional efficiencies in power transfer. Specifically, the combination of RF inductive resonant power transfer, rectification, and hybrid PWM-PFM regulation may, in some implementations, offer superior voltage and energy conversion efficiency, alleviating severe powering conditions of deep mm-size biomedical implants.

Figure 1D:
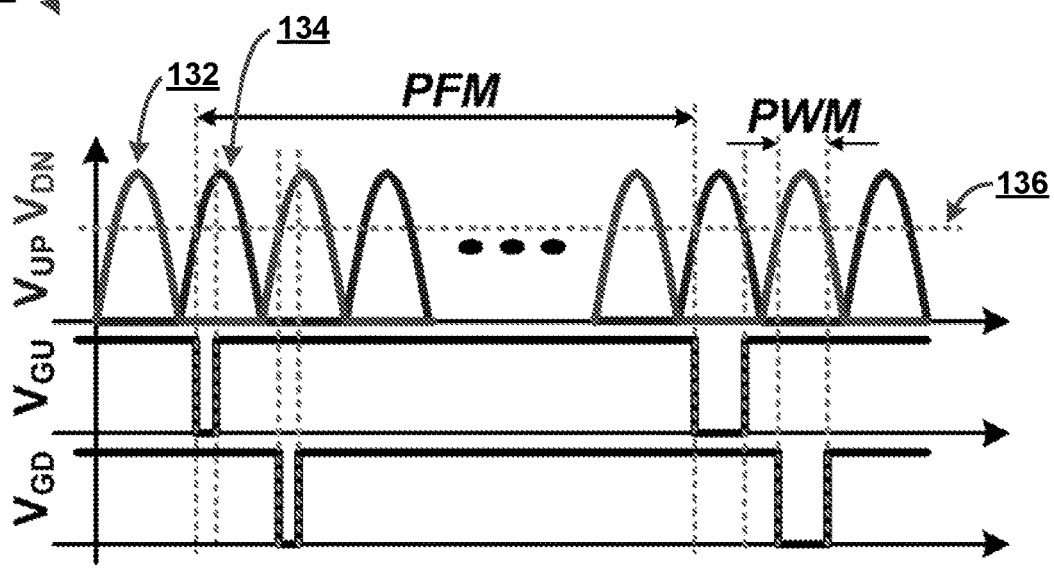
FIG. 1D depicts example implementations of pulse-frequency modulation and pulse-width modulation.

FIG. 1D provides a diagram 130 showing example implementations of pulse-frequency modulation and pulse-width modulation. The top half of the diagram 130 depicts the positive portions of $V_{UP}$ and $V_{DN}$ over time. As illustrated, the first peak 132 and every other subsequent peak represent the voltage value of $V_{DN}$. Similarly, the second peak 134 and every other subsequent peak represent the voltage value of $V_{UP}$. The values of $V_{UP}$ and $V_{DN}$ may be measured and/or may affect the switching on/switching off of $V_{GU}$ and $V_{GD}$, respectively. For example, sometime before the first illustrated peak 134 of $V_{UP}$, the signal for $V_{GU}$ may go low, which may drive the corresponding transistor 122, and allow power to flow to $V_{DD}$.

The switching time can be dictated by threshold 136, which may be representative of a value of $V_{DD}$. Thus, in some aspects, when $V_{UP}$ reaches the value of $V_{DD}$, the signal for $V_{GU}$ may be driven low. $V_{GU}$ may return to a high signal some point in time after $V_{UP}$ crosses the threshold, which may be dictated by the illustrated pulse width modulation. For example, in the illustrated example, $V_{GD}$ may only signal low for less than half of the time that $V_{UP}$ is greater than $V_{DD}$. As also illustrated, $V_{GD}$ may signal low for the entire time that $V_{UP}$ is greater than $V_{DD}$. This timing may correspond to no pulse modulation. Similar use of $V_{GD}$ based on $V_{DN}$ may also be performed.

Further, the frequency of which $V_{GU}$ and/or $V_{GD}$ are switched on or switched off may be controlled through pulse frequency modulation. For example, as illustrated, the first peak 132 of $V_{DN}$ may not drive $V_{GD}$ low, but the second peak does. The number of subsequent peaks of $V_{DN}$ which occur before driving $V_{GD}$ low again can be dictated by pulse frequency modulation. Similar use of $V_{GU}$ based on $V_{DN}$ may also be performed. Performing pulse width modulation simultaneously with pulse frequency modulation can allow for simultaneous rectification and regulation of a received RF signal.

Figure 1E:
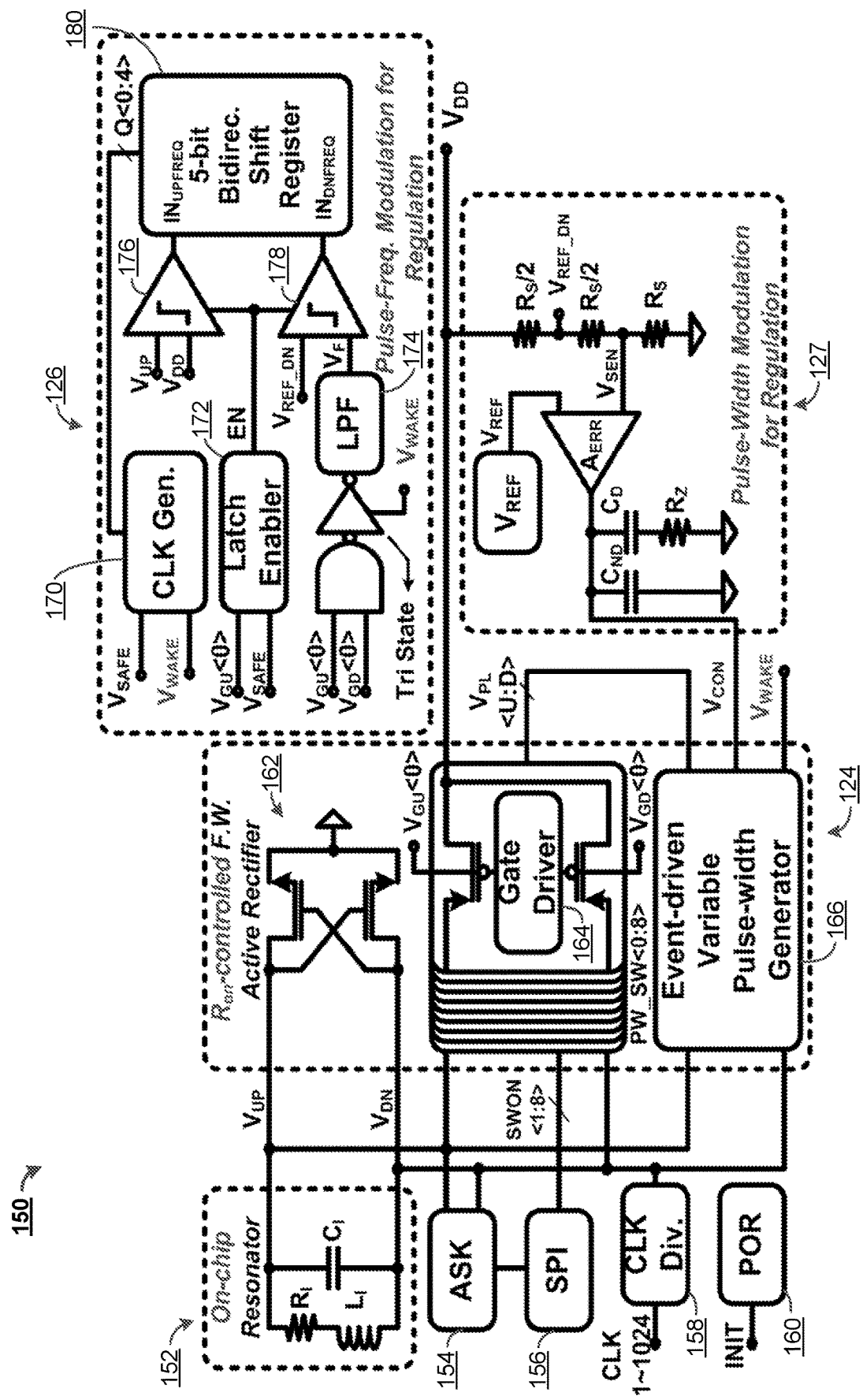
FIG. 1E depicts another example of an integrated resonant regulating rectifier.

FIG. 1E depicts another example of an integrated resonant regulating rectifier 150. As illustrated, the integrated resonant regulating rectifier 150 includes an on-chip resonator 152, which provides $V_{UP}$ and $V_{DN}$. The integrated resonant regulating rectifier 150 further includes an amplitude shift keying (ASK) circuit 154, an serial peripheral interface bus (SPI) circuit 156, a clock divider 158, and/or a power on reset (POR) circuit 160, each of which may provide one or more inputs to the pulse generator 124. The pulse generator 124 may include an $R_{on}$-controlled frequency wave active rectifier 162, a gate driver 164, and/or an event-driven variable pulse-width generator 166. In some aspects, the rectifier 162 may include a half-wave rectifier, which may be used to generate half-wave signals of $V_{UP}$ and/or $V_{DN}$. The gate driver 164 may be used to control capacitors based on $V_{GU}$ and $V_{GD}$ to generate $V_{DD}$. The generator 166 may receive $V_{UP}$ and $V_{DN}$, may receive signal $V_{CON}$ from the pulse-width modulator 126, may receive signal $V_{WAKE}$ from the pulse frequency generator 122, and/or may provide output $V_{PL<U:D>}$ to control the gate driver 164 (e.g., to signal when to close one or both of the transistors). PWM controls the pulse width of $V_{GU}$ and $V_{GD}$ based on $V_{CON}$. Specifically, the pulse width modulator 126 may receive $V_{DD}$ as an input, which is voltage divided (e.g., through resistors) to form signal $V_{SEN}$ (which may be half of $V_{DD}$). $V_{SEN}$ is then compared against reference voltage $V_{REF}$ by the error amplifier $A_{ERR}$. In some aspects, $V_{REF}$ can be 0.4V. Based upon the comparison, the error amplifier $A_{ERR}$ can output a signal which can be controlled by one or more capacitors to form signal $V_{CON}$. In some aspects, $V_{CON}$ may be an analog signal indicating whether $V_{DD}$ is higher (or lower) than a target voltage (e.g., 0.8V may be the target voltage).

Owing to large loop gain in analog feedback, PWM can offer accurate regulation of the RF input to generate the $V_{DD}$. However, due to stability requirements, the response time of PWM analog feedback can range several microseconds. Due to high resonant frequency, the time duration when a RF input ($V_{UP}$ or $V_{DN}$) is higher than $V_{DD}$ can be very short (e.g., approximately a few hundred or thousand pico-second scale). Thus, PWM may not be able to cover wide a range regulation with a high bandwidth. To address these challenges, an auxiliary feedback loop employing PFM may be used, and may feature rapid digital feedback. As illustrated, the pulse frequency modulation circuit 122 can include a clock generation circuit 170, a latch enabler 172, a low-pass filter 174, an upper latch 176, a lower latch 178, and/or a bidirectional shift register 180. In various implementations, based upon $V_{GU<0>}$ (e.g., the current pulse width) and $V_{SAFE}$ as inputs, the latch enabler 172 may provide EN as an output to enable one or both of the upper latch 176 and the lower latch 178. For example, if $V_{SAFE}$ is high, the latch enabler 172 turns on both latches 176, 178 when $V_{GU<0>}$ turns back to $V_{DD}$. As described in further detail below, $V_{SAFE}$ may be a signal which controls the number of times per time period that the pulse width of $V_{GU}$ and/or $V_{GD}$ are checked.

Using the latch enabler 172 and the upper latch 176, the digital feedback can monitor whether the pulse duration of $V_{GU}$ is too long (e.g., whether it has reached a maximum duration threshold), which may lead to reverse current loss. If this occurs, the pulse frequency modulator 126 can command the pulse generator 166 to increase its operating digital frequency, by asserting $V_{WAKE}$. In some aspects, the maximum threshold duration may indicate that $V_{GU}$, for example, is low during the entire time (or substantially the entire time) that $V_{UP}$ is greater than $V_{DD}$ (see FIG. 1D). Conversely, if the pulse width is too short (e.g., whether it has reached a minimum duration threshold), the bottom latch 178 may detect that $V_F$ exceeds $V_{REF\_DN}$, and signal to decrease the digital frequency of the pulse generator 166. Specifically, as illustrated, the pulse frequency modulation circuit 126 may receive $V_{GU<0>}$ and $V_{GD<0>}$ as inputs of a NAND gate. The NAND can provide an output to a tri-state inverter, which is controlled by $V_{WAKE}$. The output of the tri-state inverter is provided to a low-pass filter 174, which provides $V_F$ as an output. $V_F$ is then compared by the bottom latch to $V_{REF\_DN}$ to determine whether the pulse width modulation is too short. In some aspects, the minimum duration threshold may be a value that indicates that the current pulse width modulation is zero (or approximately zero).

This scheme of detecting whether pulse width modulation is at a maximum or minimum threshold duration, and controlling the pulse frequency modulation based on the determination, can provide for simultaneous PWM and PFM of an RF input. As a non-limiting example of a benefit of this control scheme, a received RF signal may be simultaneously (or near simultaneously) rectified and regulated to generate $V_{DD}$. This scheme may aid in only providing the necessary voltage to power a device/load with minimal power loss. Although $V_{GU}$ and $V_{UP}$ are illustrated as being the reference values for the latch enabler 172 and the upper latch 176, respectively, $V_{GA}$ and $V_{DN}$ may additionally or alternatively be used as reference values.

In some example implementations, the bidirectional shift register 180 includes five output bits, Q<0:4>, which may be used to select the digital frequency of the pulse generator 166. For example, Q<0> can lead to providing the RF-wave frequency, Q<1> can lead to providing the RF-wave frequency/4, Q<2> can lead to providing the RF-wave frequency/8, and so on. Specifically, based at least in part upon the value of Q<0:4>, the clock generator may generate a value for $V_{SAFE}$ and or $V_{WAKE}$. In some aspects, $V_{WAKE}$ is a binary value for turning on the generator 166 to generate a pulse. Changing the digital frequency of the pulse generator can provide PFM of an RF input to generate an output voltage $V_{DD}$. In some aspects, RF-wave frequency can be 144 MHz. To cover an even wider range of regulation efficiently, nine parallel power switches can be turned on/off by commands from the ASK circuit 154 and/or the SPI circuit 156.

Achieving high end-to-end efficiency in the resonant regulating rectifier 150 can require careful design to manage high frequency losses at small output powers. As a result, conventional comparators that operate at 13.56 MHz or lower frequency and consume over 100 µW may not work in these applications.

Figure 2A:
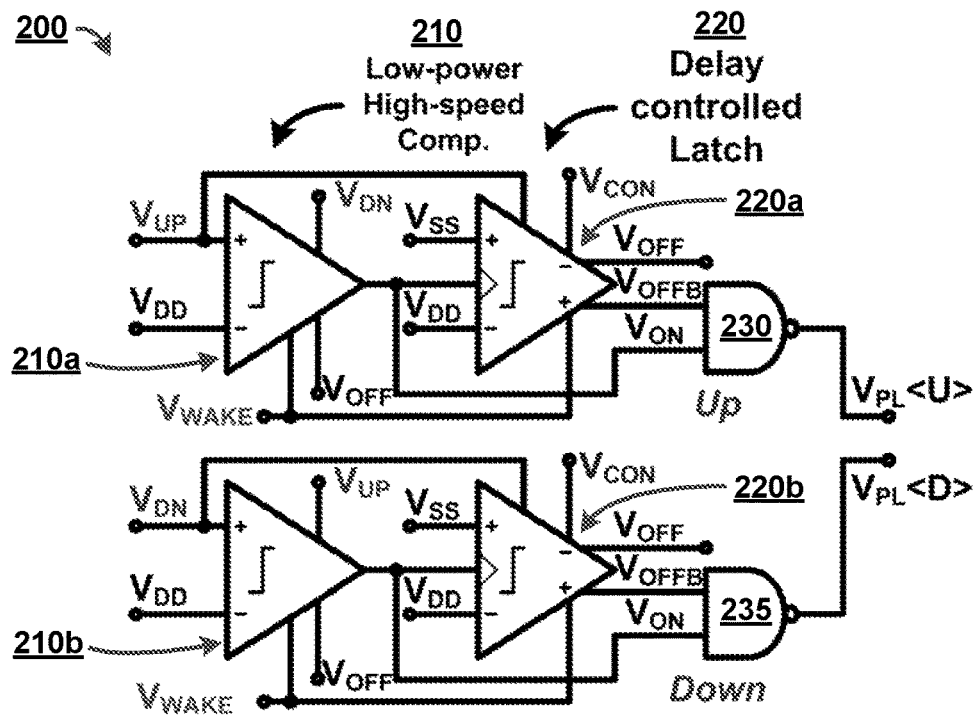
FIG. 2A depicts an example of an event-driven variable pulse-width generator.

FIG. 2A depicts an example of an event-driven variable pulse-width generator 200. As illustrated, the generator 200 may include one or more low-power, high-speed comparator 210. As further illustrated in FIG. 2A, the generator 200 may also include one or more delay-controlled latch 220. In some aspects, the low-power high-speed comparators 210 may be used to decide when to start the generation of a pulse (e.g., turn PMOS on). For example, comparator 210*a* may receive $V_{UP}$ and $V_{DD}$ as inputs, and may signal $V_{ON}$ when the inputs are equal. However, in some aspects, comparator 210*a* may not provide $V_{ON}$ as an output unless $V_{WAKE}$ signals to activate the comparator 210*a*. Similarly, comparator 210*b* may receive $V_{DN}$ and $V_{DD}$ as inputs, and may signal $V_{ON}$ when the inputs are equal. However, in some aspects, comparator 210*b* may not provide $V_{ON}$ as an output unless $V_{WAKE}$ signals to activate the comparator 210*b*.

Latch 220*a* may receive $V_{SS}$ (e.g., ground) and $V_{DD}$ as inputs, and may signal $V_{OFF}$ and/or $V_{OFFB}$ when the inputs are equal. $V_{OFF}$ and/or $V_{OFFB}$ may be binary signals, and/or may be the opposite of each other. In some aspects, one or both of $V_{OFF}$ and $V_{OFFB}$ may be used to signal that pulse generation should cease (e.g., turn off PMOS). In various implementations, this instruction may be provided to the gate driver 164. However, in some aspects, latch 220*a* may not provide $V_{OFF}$ and/or $V_{OFFB}$ outputs unless $V_{WAKE}$ signals to activate the comparator 210*a*. $V_{CON}$ may also be provided to the latch 220*a* to control a signaling delay, which in turn, can be used to provide pulse width modulation. For example, to generate a variable pulse width, the delay of the latch 220*a*, for example, can be controlled by $V_{CON}$, output of PWM. For a sufficiently high $V_{CON}$ to provide large current to the latch 220*a*, the pulse width of $V_{PL}$ can be reduced, and vice versa.

Outputs $V_{OFFB}$ and $V_{ON}$ of comparator 210*a* and latch 220*a*, respectively, can be provided as inputs to NAND gate 230, which provides $V_{PL<U>}$ as an output. Similarly, Outputs $V_{OFFB}$ and $V_{ON}$ of comparator 210*b* and latch 220*b*, respectively, can be provided as inputs to NAND gate 235, which provides $V_{PL<D>}$ as an output.

In some aspects, when $V_{UP}$ reaches its peak, $V_{ON\_PRE}$ also increases to its own DC bias point, similar to $V_{PX}$, which is near the logic-threshold of the inverter. To compensate the gate driver delay, the logic threshold of the inverter can be adjusted for a faster decision. In some example implementations, the system's simulated power consumption of the comparator 210*a*, for example, reduces to 0.15~1.5 µW at a 0.8V supply across all digital frequencies.

Figure 2B:
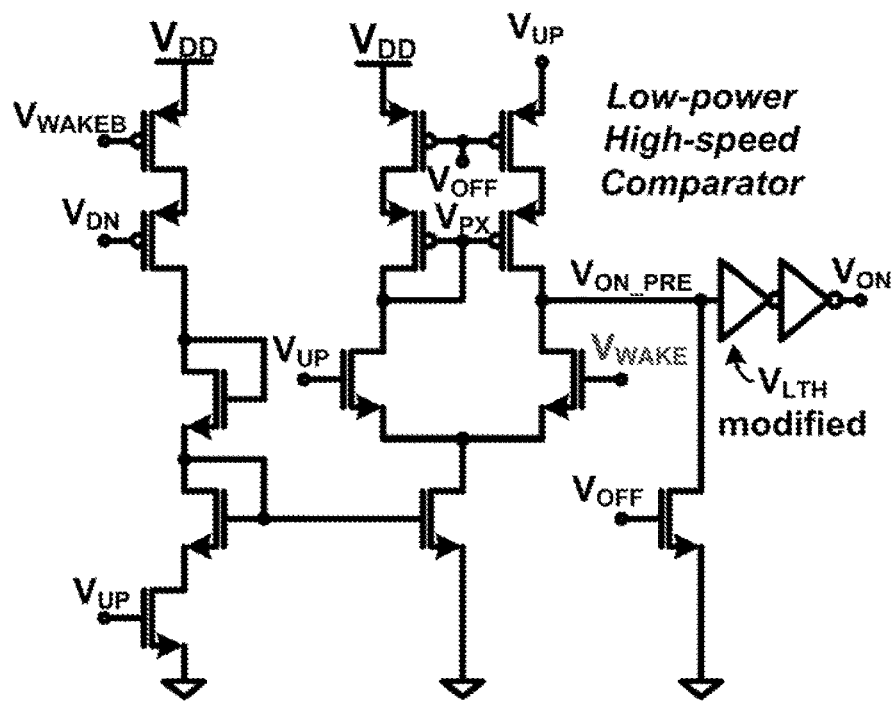
FIG. 2B depicts an example of a low-power, high-speed generator.
Figure 2C:
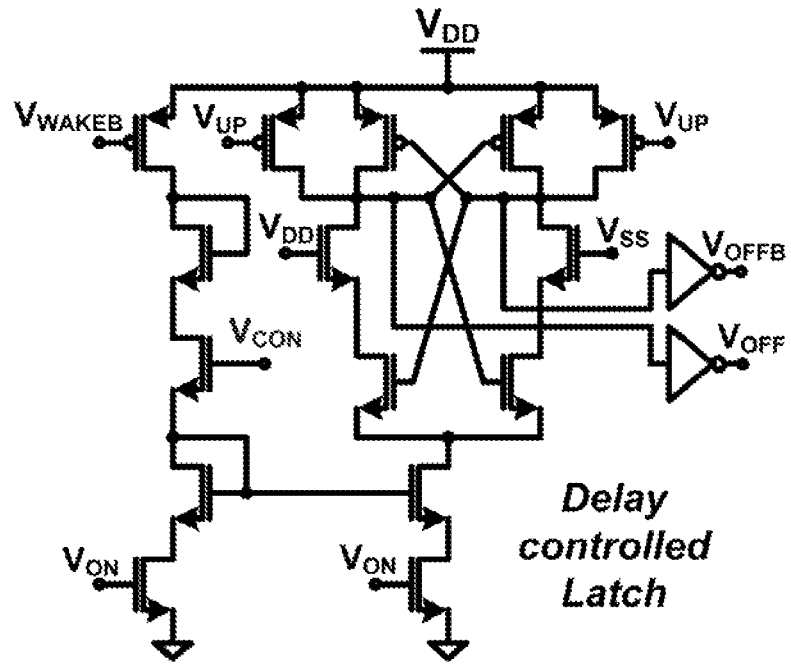
FIG. 2C depicts an example of a delay controlled latch.

FIG. 2B depicts an example of a low-power, high-speed comparator 210*a*, in accordance with various implementations. As illustrated, the comparator 210*a* can receive at least $V_{DD}$ and $V_{UP}$ as inputs, and provide $V_{ON}$ as an output. When $V_{WAKE}$ is high, $V_{WAKEB}$ is low, $V_{UP}$ is high, and $V_{DN}$ is low, then the comparator 210*a* may compare $V_{DD}$ to $V_{UP}$. The amplifier-like comparator 210*a* may use two current generation cells to improve decision speed. Although the high-speed comparator 210*a* utilizes $V_{UP}$ as an input, a similar circuit may be employed with $V_{DN}$ instead (e.g., to form the high-speed comparator 210*b*). FIG. 2C depicts an example of a delay controlled latch 220*a*, in accordance with various implementations. Although the delay controlled latch 220*a* utilizes $V_{UP}$, a similar circuit may be employed with $V_{DN}$ instead (e.g., to form the delay controlled latch 220*b*).

Figure 3A:
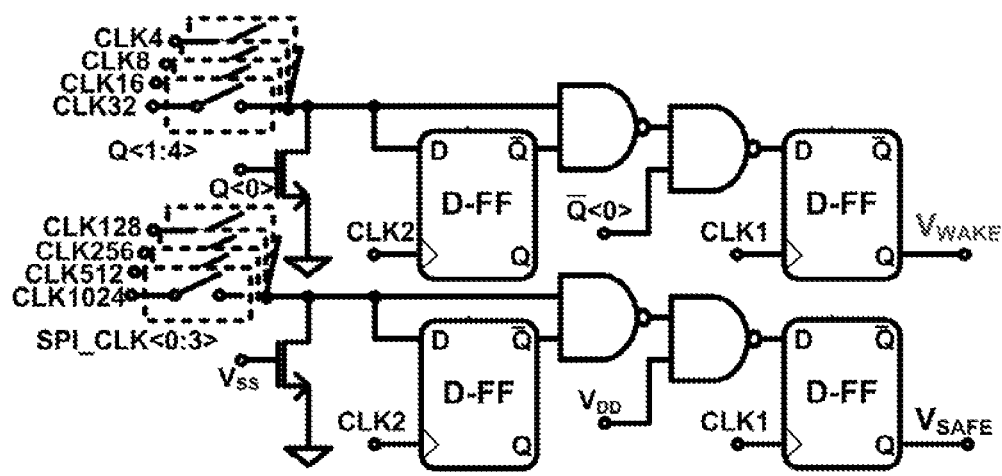
FIG. 3A depicts an example clock generator.

FIG. 3A depicts an example clock generator 300. In some aspects, the clock generator 300 may be similar to the clock generator 170 of FIG. 1E. The clock generator 300 can monitor pulse width of power PMOS gate voltages regularly with a safety-check clock $V_{SAFE}$ which may be changeable from 0.88 μs (e.g., CLK128: 144 MHz/128) to 7.1 μs (e.g., CLK1024: 144 MHz/1024). Changing $V_{SAFE}$ can allow for the current pulse width modulation to be checked more frequently or less frequently (e.g., to determine whether it has reached its maximum or its minimum). This may provide additional efficiencies, as the speed at which the pulse width modulation may change can be slower (e.g., because it can be implemented as an analog control-based modulation).

Figure 3B:
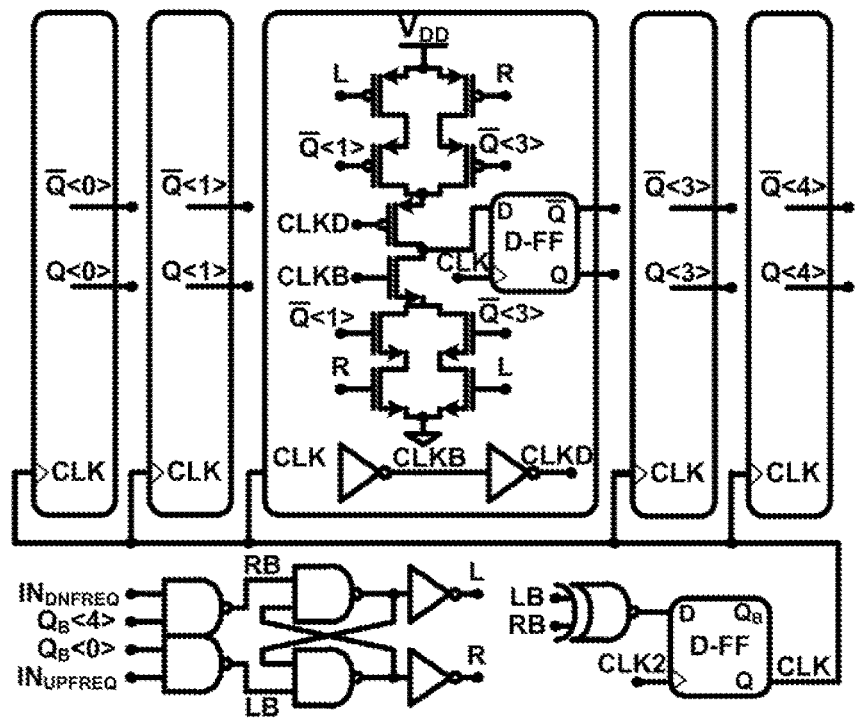
FIG. 3B depicts an example bidirectional shift register.
Figure 3C:
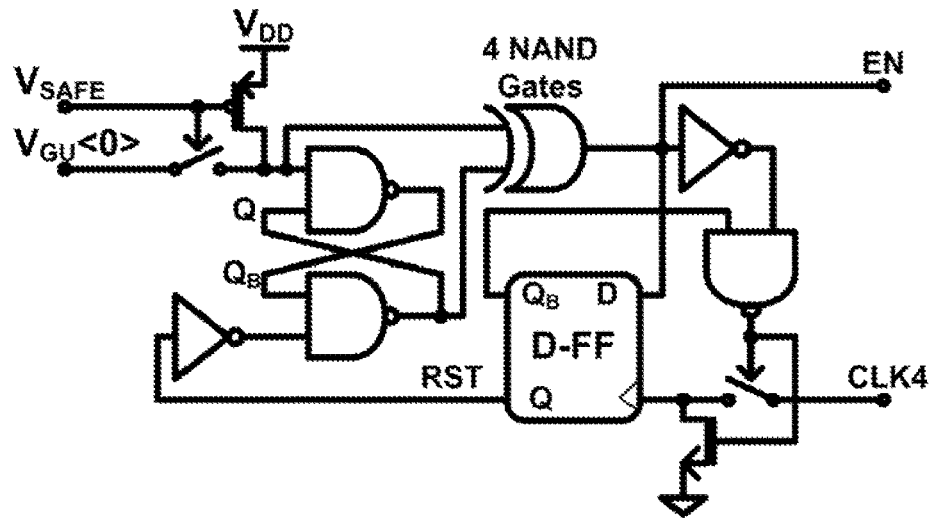
FIG. 3C depicts an example latch enabler.

FIG. 3B depicts an example bidirectional shift register 310. In some aspects, the bidirectional shift register 310 may be similar to the bidirectional shift register 180 of FIG. 1E. FIG. 3C depicts an example latch enabler 320. In some aspects, the latch enabler 320 may be similar to the latch enabler 172 of FIG. 1E. To save power, clock-gated true single phase clocked (TSPC) D-flip flops are employed. By clock gating, the latch enabler 320 may only operate when events occur. The same rule may apply to the bidirectional shift register 310. If the latches make a decision to change the digital frequency, the shift register generates a clock to update the digital frequency. Owing to event-driven design, the latch enabler 320 and/or the shift register 310 may consume under 0.5 μW.

Figure 4:
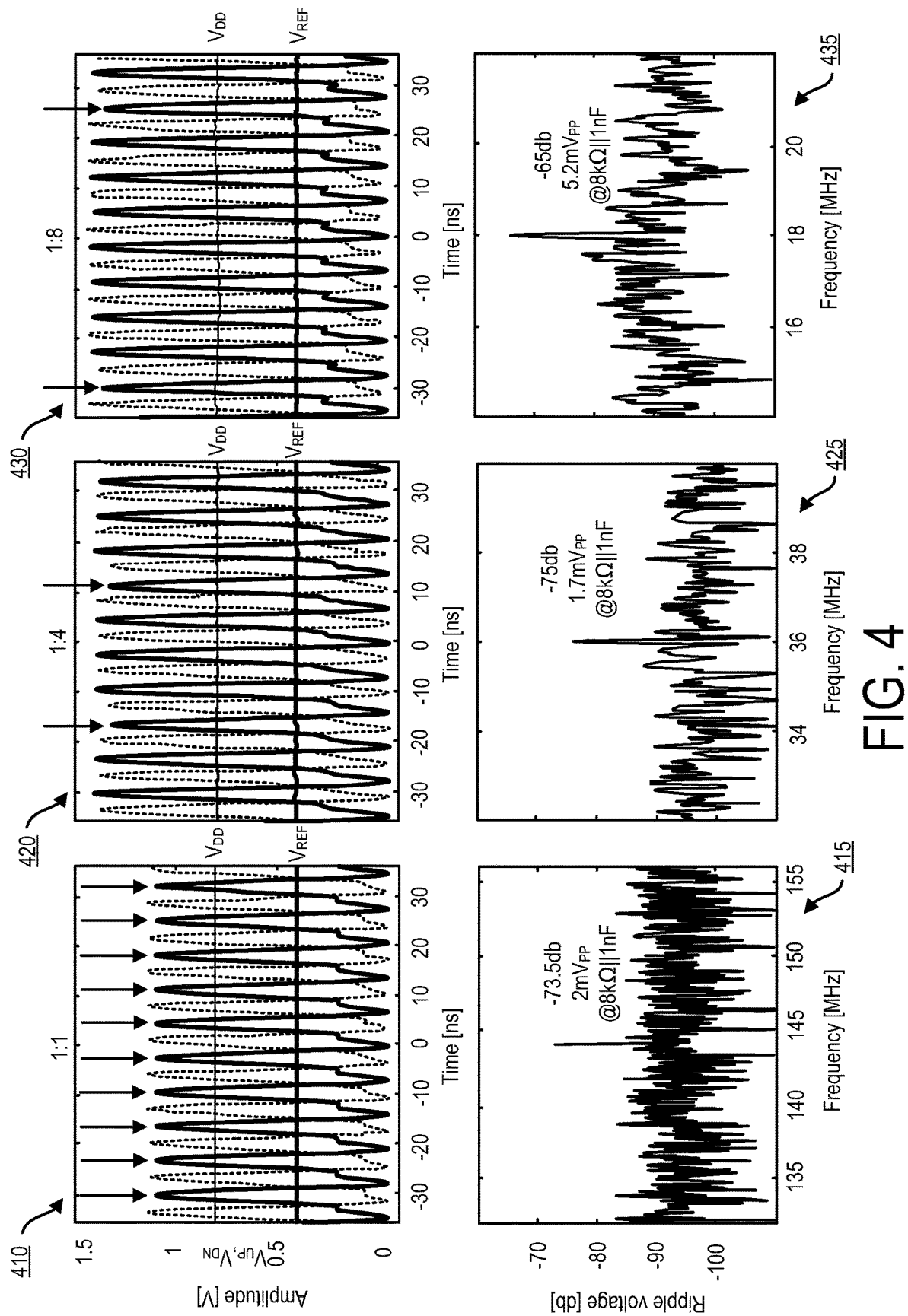
FIG. 4 depicts example amplitude and ripple voltage measurement data.

FIG. 4 depicts example amplitude and ripple voltage measurement data. The measurement data illustrates measurements of the integrated resonant regulating rectifier design for $V_{DD}$ at 0.8V within 5 mVpp ripple for various frequency modulations under varying RF inputs. Graph 410 provides values of $V_{DN}$, $V_{UP}$, $V_{DD}$, and $V_{REF}$ over time in an implementation where the operational frequency is 144 MHz (or approximately 144 MHz). For example, graph 415 shows the peak operational frequency at 144 MHz (or approximately 144 MHz). As illustrated in graph 410, each peak of $V_{UP}$ may be amplitude modulated. Accordingly, graph 410 may illustrate the lowest RF, in accordance with various implementations. Graph 420 provides values of $V_{DN}$, $V_{UP}$, $V_{DD}$, and $V_{REF}$ over time in an implementation where the operational frequency is 36 MHz (or approximately 36 MHz) (e.g., 144 MHZ/4). For example, graph 425 shows the peak operational frequency at 36 MHz (or approximately 36 MHz). As illustrated in graph 420, one in four peaks of $V_{UP}$ may be amplitude modulated. Accordingly, graph 420 may illustrate a higher RF than graph 410, in accordance with various implementations. Graph 430 provides values of $V_{DN}$, $V_{UP}$, $V_{DD}$, and $V_{REF}$ over time in an implementation where the operational frequency is 18 MHz (or approximately 18 MHz) (e.g., 144 MHZ/8). For example, graph 435 shows the peak operational frequency at 18 MHz (or approximately 18 MHz). As illustrated in graph 430, one in every eight peaks of $V_{UP}$ may be amplitude modulated. Accordingly, graph 430 may illustrate the highest RF, in accordance with various implementations.

Millimeter-sized modular, neural interfacing devices may be enabled by integrating wireless power transfer functionality on-chip.

Figure 5:
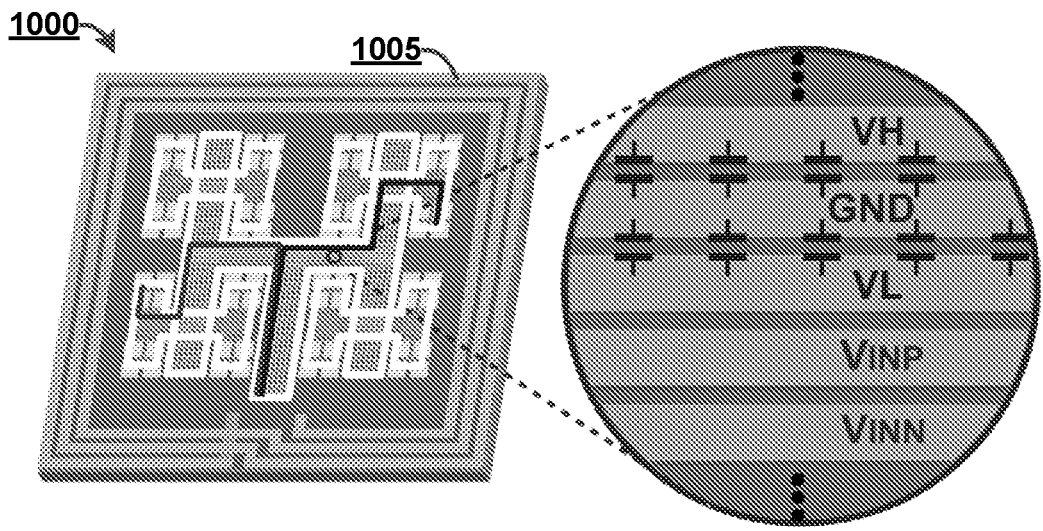
FIG. 5 depicts an example of a circuit which includes an H-tree distribution.

FIG. 5 depicts an example of a circuit 1000 which includes an H-tree distribution. As illustrated, the circuit 1000 may include an on-chip antenna 1005 near the perimeter of the chip. The antenna 1005 may be in the form of a loop, so that it may receive wireless power from a transmit coil of a wireless power transmitter (not shown). However, other wires in the circuit 1000 may incidentally pick up wireless power signals if they are in the form of a loop. For example, in the 0-100 MHz range, RF power delivered to an on-chip coil can induce eddy currents in auxiliary on-chip wiring and/or metal planes, which can degrade wireless power transfer efficiency while also potentially disrupting the functionality of underlying circuitry. Thus, at least a portion of the wires in the circuit 1000, other than the on-chip antenna, may be placed in an "H-tree" configuration. The H-tree configuration can refer to one or more wires which do not form a loop and/or have equidistant (or near equidistant) paths.

Ad-hoc routing of supply lines and placement of decaps can create multiple loops and metal planes, reducing efficiency. Thus, to avoid large metal planes, decoupling capacitance (decaps) can be reduced to only 20 pF through inclusion of a high-performance, high-power linear regulator. In some implementations, a fractal H-tree power and signal distribution network with 1 nF of distributed decaps may be utilized to remove/reduce loops and large planes from the layout. In some aspects, an H-tree topology can serve as a network backbone for cancellation of differential-mode interference in sensitive analog differential signals.

As illustrated, the circuit 1000 may include one or more wires VH, GND, VL, $V_{INP}$, and/or $V_{INN}$. In some aspects, the circuit 1000 may receive RF energy through an on-chip coil, and may use the RF energy to establish dual DC rails, VH and VL. In some aspects, VH, GND, and/or VL may be representative power lines. In some aspects, $V_{INP}$ and/or $V_{INN}$ can be signal lines used for operation of the circuit 1000. As explained herein, use of an H-tree distribution can decrease the possibility of eddy current generation, and/or residual RF interference can be converted to a common-mode noise which can be rejected by differential circuits.

Figure 6:
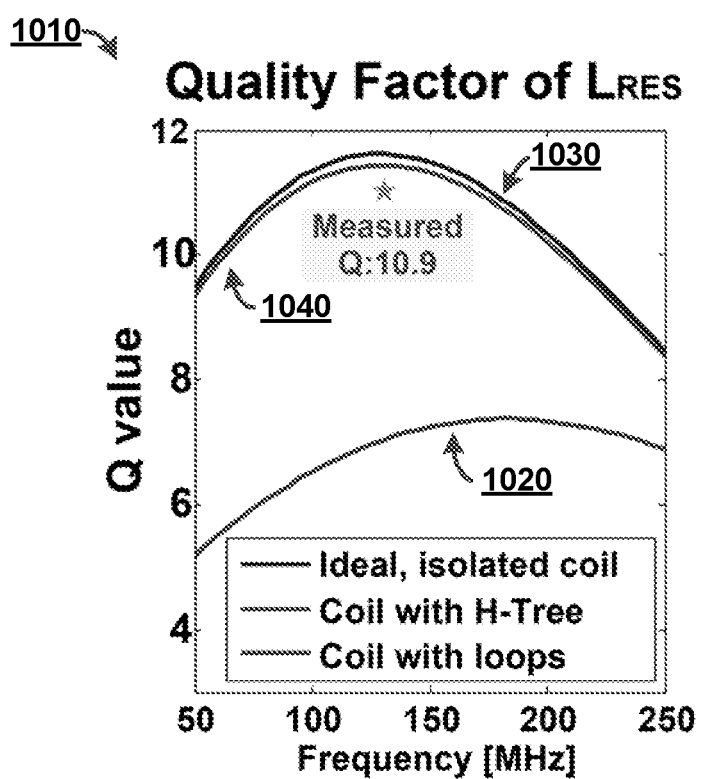
FIG. 6 depicts example quality factor data.

FIG. 6 provides a graph 1010 depicting example quality factor data. A Q value of a circuit which includes an isolated coil (e.g., just an antenna) may peak around 11.5 at/around 144 MHz, as represented by line 1030. This configuration may be considered as a test case for ideal operations. As illustrated, a Q value of a circuit which includes a coil (e.g., an antenna) and loops (e.g., wires other than the antenna) may peak at approximately 7.0 (over 60% reduction from the test case), as represented by line 1020. This reduction in Q factor can reduce wireless power transfer efficiency, while also introducing noise into sensitive circuits. As further illustrated, a Q value of a circuit which includes a coil (e.g., an antenna) and an H-tree configuration (e.g., wires other than the antenna) may peak at approximately 10.9, as represented by line 1040. Such a reduction from an the test case may be considered negligible. As such, an H-tree distribution may provide efficient and robust wireless power transfer over a wide range of input and load conditions. In some aspects, an H-tree power/signal distribution may be referred to as low-loss.

Figure 7:
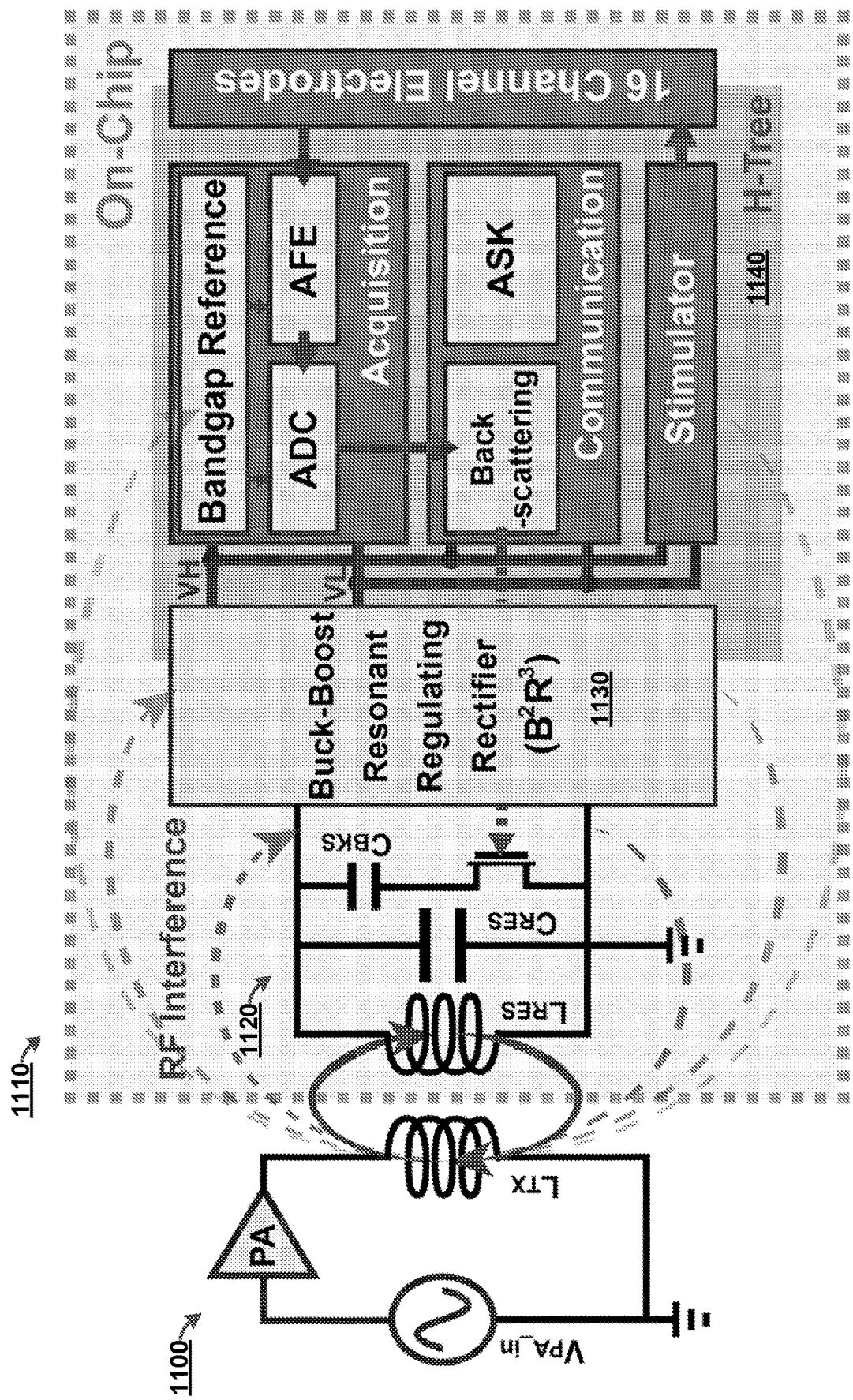
FIG. 7 depicts an example wireless power transfer to a circuit which includes a buck-boost resonant regulating rectifier and an H-tree distribution.

FIG. 7 depicts an example wireless power transfer between a wireless power transmitter 1100 and a receiver circuit 1110 which includes a buck-boost resonant regulating rectifier 1130 and an H-tree distribution. As illustrated, wireless power may be received through an inductive circuit 1120. As above, RF interference may occur based at least in part upon the configuration of circuit 1110. Accordingly, at least a portion 1140 of the receiver circuit 1110 may be in an H-tree configuration. In some implementations, other than the antenna, all wires in receiver circuit 1110 may be in an H-tree configuration. The receiver circuit 1110 can provide for robust reception of wireless power over a wide range of conditions. In various implementations, the receiver circuit 1110 can achieve this by fully integrating an on-chip coil with distributed perpendicular decoupling and loop-free H-tree geometry for power lines and/or signal distribution networks, which can be optimized for maximum RF power collection and minimum RF interference. Additionally or alternatively, in various implementations, the receiver circuit 1110 can achieve robust wireless power reception by employing a regulating rectifier that dynamically adapts to a wide range (e.g., greater than 14 dB) of RF input by switching between boost and buck modes, while providing a dual-rail supply from lower magnitude RF input signals. Further, in various implementations, the receiver circuit 1110 can achieve robust wireless power reception by including a control feedback loop (e.g., 0.86 µW) that offers fast load regulation performance while supporting both boost and buck regulating rectifiers.

Figure 8:
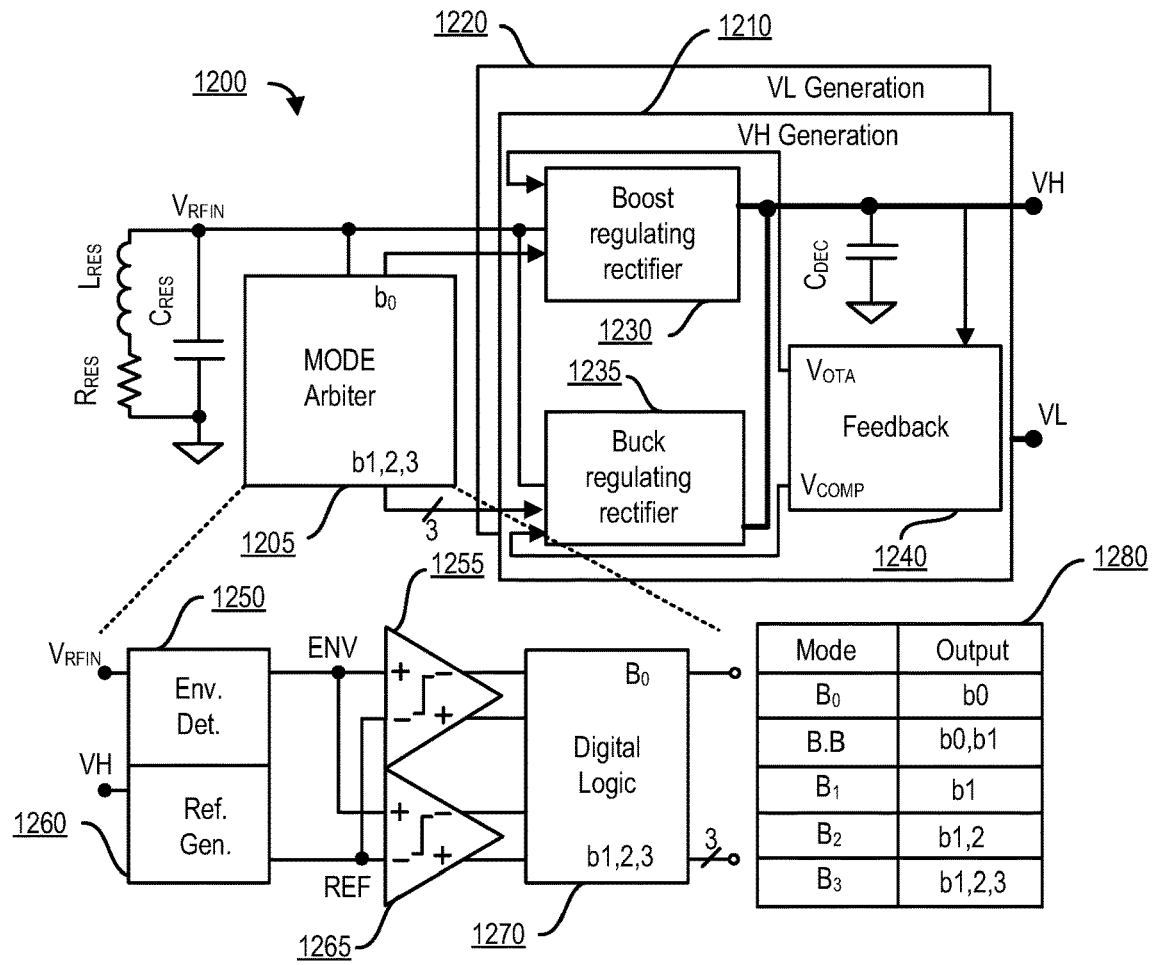
FIG. 8 depicts an example buck-boost resonant regulating rectifier.

FIG. 8 depicts an example buck-boost resonant regulating rectifier 1200. In some aspects, the buck-boost resonant regulating rectifier 1200 may be similar to the buck-boost resonant regulating rectifier 1130 of FIG. 7. As illustrated, the buck-boost resonant regulating rectifier 1200 may receive input voltage $V_{RFIN}$ (e.g., through wireless power transfer), which may be used as an input of a mode arbiter 1205, a boost regulating rectifier 1230, and/or a buck regulating rectifier 1235. The mode arbiter 1205 may include an envelope detector 1250, which receives $V_{RFIN}$, measures RF, and outputs ENV. The mode arbiter 1205 may also include a reference generator 1260, which receives VH and outputs REF. As illustrated, ENV and REF may be provided as inputs to comparator 1255 and comparator 1265. The outputs of comparator 1255 and comparator 1265 may be provided to a digital logic circuit 1270, which may output digital logic based upon the received signals. The digital logic output may be provided in accordance with logic table 1280. Specifically, the digital logic circuit 1270 may signal bo to operate the boost regulating rectifier 1230 and/or may signal at least one of b1, b1,2, or b1,2,3 to operate the buck regulating rectifier 1235. Based upon the signaled mode, the received signal may be boosted and/or bucked to generate the dual DC rails VH and VL (e.g., which form a rectified and regulated signal), which can be used to power a device.

Figure 9:
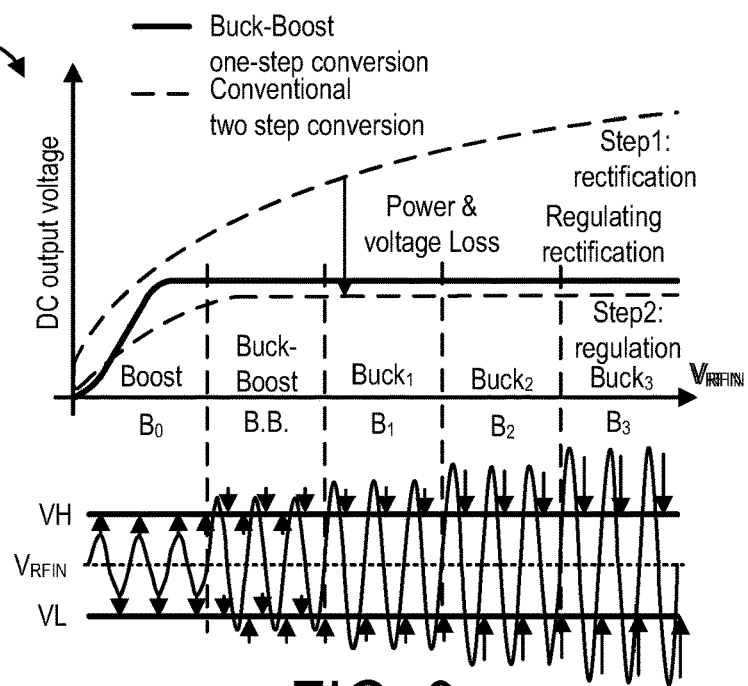
FIG. 9 depicts an example of power and voltage loss reduction phase diagram.

Although two-step rectification and regulation can operate at wide input ranges, regulation is increasingly inefficient at larger RF input voltages. The buck-boost resonant regulating rectifier 1200 on the other hand, can accomplish regulated rectification over a wide input range through the mode arbiter 1205 adapting to the sensed RF envelope. FIG. 9 depicts an example of power and voltage loss reduction phase diagram 1290. As illustrated, when $V_{RFIN}$ is first received (e.g., phase $B_0$), it may be lower than a desired voltage. Therefore, the voltage may be boosted so that it reaches a value sufficient to operate a device and/or charge a load, for example. Conventionally, the received voltage $V_{RFIN}$ may be boosted to a value that is higher than necessary (e.g., Step 1: rectification), and regulated thereafter (e.g., Step 2: regulation). However, this two-step process can result in power and voltage loss.

In order to optimize this process, in various implementations, rather than simply boosting and/or bucking the received voltage $V_{RFIN}$, the received voltage $V_{RFIN}$ can be simultaneously regulated and boosted and/or bucked. For example, in phase $B_0$, the received voltage $V_{RFIN}$ can be simultaneously boosted and regulated, in phase B.B., the received voltage $V_{RFIN}$ can be simultaneously boosted, bucked, and regulated, and/or in each of phases $B_1$-$B_3$, the received voltage $V_{RFIN}$ can be simultaneously bucked and regulated. In some aspects, phase $B_2$ may include bucking the received voltage $V_{RFIN}$ by a greater amount than phase $B_1$, and phase $B_3$ may include bucking the received voltage $V_{RFIN}$ by a greater amount than phase $B_2$. Boost mode can convert low RF voltage to a larger regulated DC voltage, while Buck$_{1-3}$ modes can efficiently convert larger RF voltages down. In some implementations, the number in Buck modes 1-3 may correspond to a number of active switches. For a smooth transition between modes, a combined Buck-Boost mode can operated at an intermediate region. In various implementations, VH may be 0.4V (or approximately 0.4V) and/or VL may be −0.4V (or approximately −0.4V). Collectively, VH and VL may be used to provide 0.8V of DC to a load or other circuit.

Referring back to FIG. 8, the buck-boost resonant regulating rectifier 1200 may further include a feedback circuit 1240. As illustrated, the feedback circuit 1240 may receive VH as an input, may provide $V_{OTA}$ as an output to control the boost regulating rectifier 1230, and/or may provide $V_{COMP}$ as an output to control the buck regulating rectifier 1235. In various implementations, the boost regulating rectifier 1230, the buck regulating rectifier 1235, and/or the feedback circuit 1240 may be part of a VH generation circuit 1210. The same or additional, similar boost regulating rectifier 1230, buck regulating rectifier 1235, and/or the feedback circuit 1240 may also be part of a VL generation circuit 1220 (with VL as an output of the generation circuit instead of VH).

Figure 10:
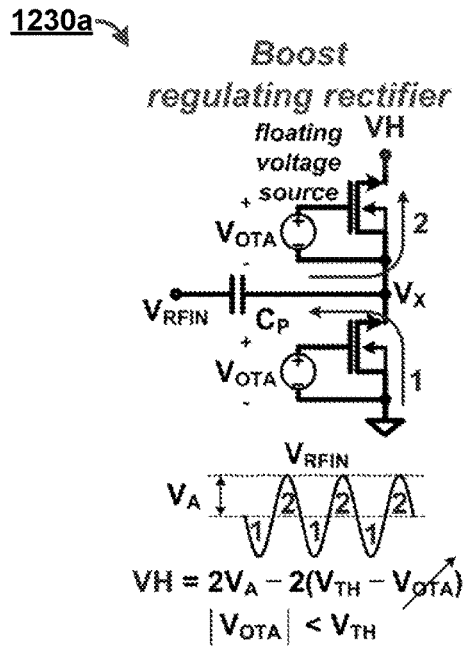
FIG. 10 depicts an example boost regulating rectifier.
Figure 11:
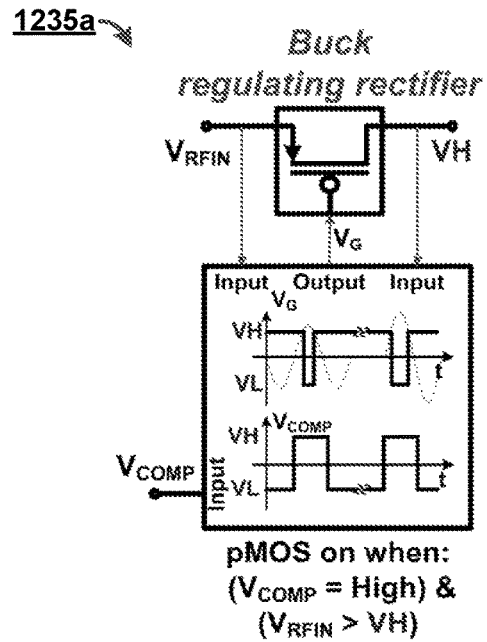
FIG. 11 depicts an example buck regulating rectifier.

FIG. 10 depicts an example boost regulating rectifier 1230a. The boost regulating rectifier 1230a may be similar to the boost regulating rectifier 1230 of FIG. 8. With a floating voltage source, $V_{TH}$ of NMOS in the boost regulating rectifier 1230a can be canceled dynamically by $V_{OTA}$ from the feedback circuit 1240 for regulation functionality. The feedback loop dynamically determines the amount of $V_{TH}$ cancellation though $V_{OTA}$. Thus, as illustrated, according to the illustrated formula VH=$2V_A$−$2(V_{TH}$−$V_{OTA})$ (where $V_A$ is an amplitude of the received RF signal), the value of $V_{OTA}$ may vary in order to regulate VH. FIG. 11 depicts an example buck regulating rectifier 1235a. The buck regulating rectifier 1235a may be similar to the buck regulating rectifier 1235 of FIG. 8. As illustrated, $V_{COMP}$ from the feedback can turn on/off the buck regulating rectifier 1235a to regulate VH. VCOMP may be signaled based at least in part upon VHS and $V_{OTA}$. In some aspects, a maximum pulse-width may be used, and pulse-with modulation may not be used.

Figure 12:
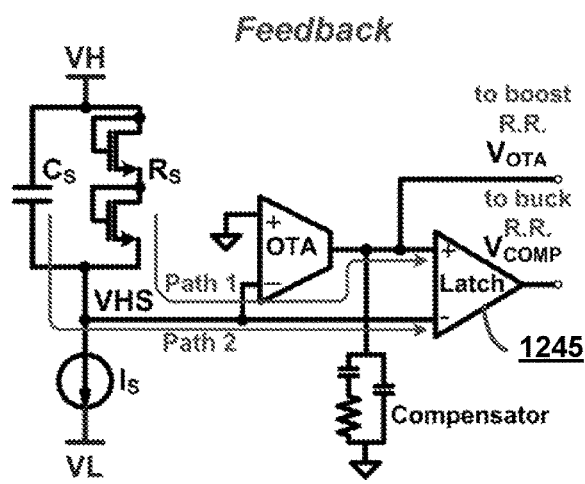
FIG. 12 depicts an example feedback circuit.

FIG. 12 depicts an example feedback circuit 1240. As shown, a VHS signal can track VH with DC offset defining a target VH. DC target voltage can be defined with $I_S$ and $R_S$ as the main feedback loop, forcing VHS to be close to GND. The use of $C_S$ in series with $R_S$ can increase detection speed. To retain the fast settling of integrator-less bang-bang control, VHS can be directly fed to the latch 1245 (e.g., Path 2), while parallel integration can perform proportional integral derivative (PID) control to additionally remove static error at VH (e.g., Path 1). Specifically, as illustrated by Path 1, operational transconductance amplification (OTA) may be performed on signal VHS to form $V_{OTA}$, which may be an input to the latch 1245. In some aspects, a compensator can be used on signal $V_{OTA}$ for the PID control. As illustrated by Path 1, VHS may be provided as another input of the latch 1245, which may be used to generate $V_{co}$.

Figure 13:
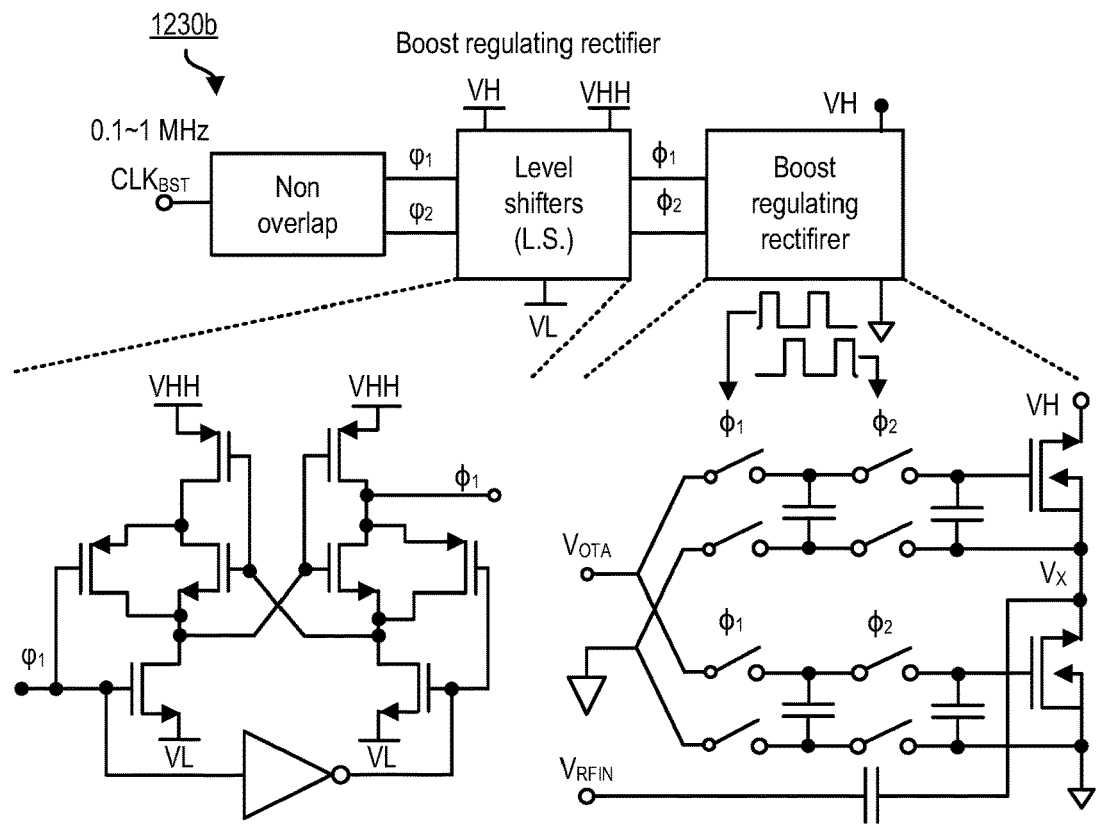
FIG. 13 depicts another example boost regulating rectifier.
Figure 14:
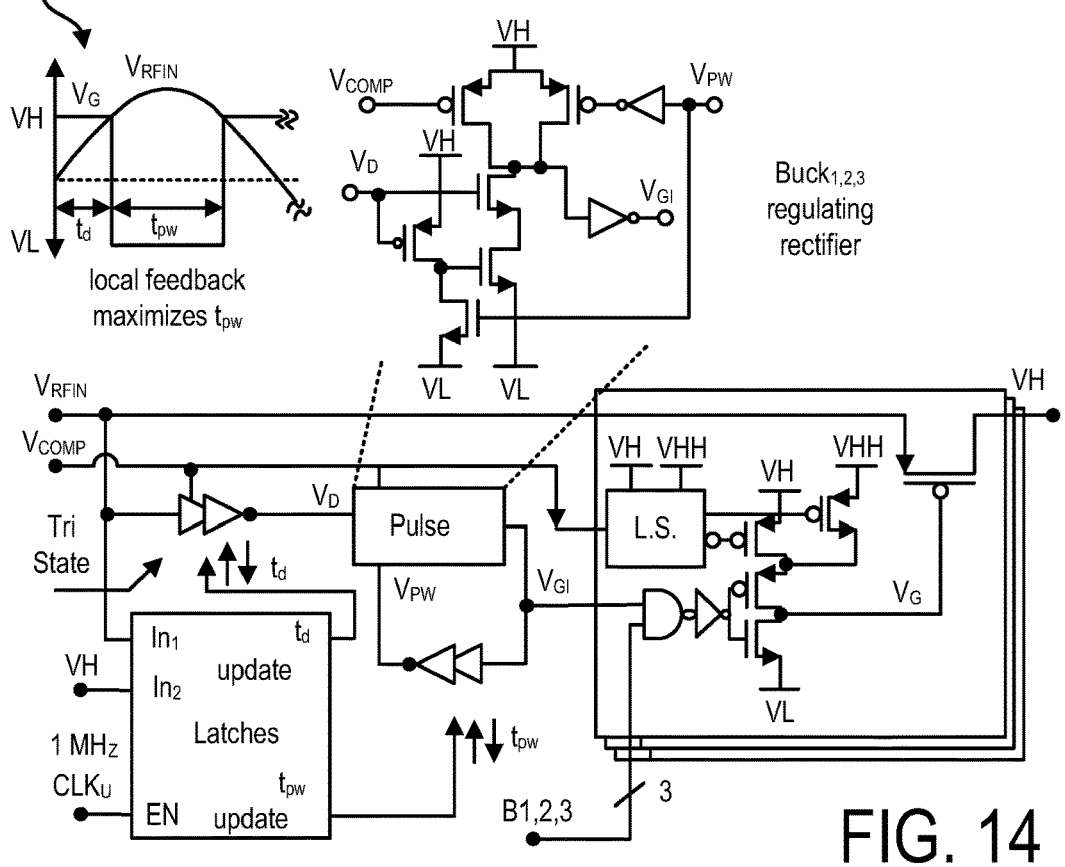
FIG. 14 depicts another example buck regulating rectifier.

FIG. 13 depicts another example boost regulating rectifier 1230b. The boost regulating rectifier 1230b may be similar to the boost regulating rectifier 1230 of FIG. 8. As illustrated, switched capacitors implement floating voltage sources with a zero short-circuit-current level-shifter. In some aspects, the level-shifter may consume 190 nW at 1 MHz, which may be thirty-five times less than conventional designs. FIG. 14 depicts another example buck regulating rectifier 1235b. The buck regulating rectifier 1235b may be similar to the buck regulating rectifier 1235 of FIG. 8. The buck regulating rectifier 1235b can dynamically determine the duty-cycle of the active switches (e.g., $t_d$ and $t_{pw}$). As illustrated, a local feedback loop defines $t_d$ and $t_{pw}$ with 1 MHz updating CLK for maximizing $t_{pw}$. Instead of a high-speed comparator, low-power delay controlled inverter chains operating with the local feedback can be used. PMOS is gated with a higher voltage to avoid making a diode connection at large RF input. Specifically, to prevent undesired energy transfer from a large RF input, the power PMOSs are gated with a voltage (VHH) larger than the RF envelope. Three power switched are implemented (e.g., corresponding to Buck modes 1-3) in parallel to optimize PCE according to RF input.

FIG. 15A provides a graph 1300 depicting example voltage and buck-boost modes. As illustrated, over time the modes of the buck-boost resonant regulating rectifier 1200, for example, may change based upon the value of the received voltage $V_{RFIN}$. FIG. 15B provides another graph 1310 depicting example voltage and buck-boost modes. As above, over time the modes of the buck-boost resonant regulating rectifier 1200, for example, may change based upon the value of the received voltage $V_{RFIN}$. FIGS. 15A-B demonstrate robustness of a buck-boost resonant regulating rectifier to changes in RF input power dynamically through the proposed mode-change of the mode arbiter 1205, for example. Specifically, the buck-boost resonant regulating rectifier can produce regulated output voltages even under 50% amplitude variation in PA input by adapting its modes dynamically. RF input power can vary due to a number of reasons, such as link distance, alignment, and/or impedance matching.

FIG. 16A provides a graph 1410 depicting example undershoot data and FIG. 16B provides a graph 1420 depicting example overshoot data. Owing too the fast feedback loop (even with only 0.25 nF in decaps (e.g., two 0.5 nF in series), negligible overshoot and/or undershoot may be observed with the use of the buck-boost resonant regulating rectifier (denoted by $B^2R^3$), while conventional designs (denoted by [6]) may show greater than 100 mV overshoot and/or undershoot. In some aspects, a negligible overshoot and/or undershoot may be due, at least in part, to the use of PID control of the feedback circuit 1240.

FIG. 17 illustrates a flowchart of an exemplary method 1700 of receiving wireless power. Method 1700 may be performed by one or more of the devices, circuits, or the like described herein. For example, at least a portion of the method 1700 may be performed by the integrated resonant regulating rectifier 110, the buck-boost resonant regulating rectifier 1130, other similar circuits, and/or equivalents thereof.

Method 1700 may start at operational block 1710 where the integrated resonant regulating rectifier 110, for example, may receive a radio frequency input from a wireless power transmitter. In some aspects, the receiving may be performed by a resonant circuit.

Method 1700 may proceed to operational block 1720 where the integrated resonant regulating rectifier 110, for example, may generate an in-phase voltage and an out-of-phase voltage. In some aspects, the generating may be performed by a resonant circuit. In some aspects, the first output voltage and the second output voltage occur sequentially in time and enable providing a source of power, and/or the source of power comprises a low-voltage direct current that is regulated.

Method 1700 may proceed to operational block 1730 where the integrated resonant regulating rectifier 110, for example, may gate the in-phase voltage to provide a first output voltage. In some aspects, the gating may be performed by a pulse generation circuit. For example, the pulse generation circuit may comprise one or more gates (e.g., transistors), and gating may include opening and/or closing the gate (e.g., so that power flows through the circuit as an output voltage).

Method 1700 may proceed to operational block 1740 where the integrated resonant regulating rectifier 110, for example, may gate the out-of-phase voltage to provide a second output voltage. In some aspects, the gating may be performed by a pulse generation circuit. In various implementations, the gating of the in-phase voltage and/or the gating of the out-of-phase voltage is controlled by a pulse width modulation setting and a pulse frequency modulation setting.

In various implementations, the pulse generation circuit comprises a first transistor operatively coupled to the in-phase voltage and a second transistor operatively coupled to the out-phase voltage. In some aspects, the pulse generation circuit operates the first transistor based at least in part upon the pulse width modulation setting, the pulse frequency modulation setting, and the in-phase voltage, and/or the pulse generation circuit operates the second transistor based at least in part upon the pulse width modulation setting, the pulse frequency modulation setting, and the out-phase voltage.

In some aspects, the pulse generation circuit comprises a comparator for comparing the in-phase voltage against the first output voltage or the second output voltage to generate a first signal for turning the pulse generation circuit on, and/or the pulse generation circuit further comprises a latch circuit for comparing the first output voltage or the second output voltage against a ground signal to generate a second signal for turning the pulse generation circuit off.

Method 1700 may proceed to operational block 1750 where the integrated resonant regulating rectifier 110, for example, may provide information for controlling the pulse width modulation setting. In some aspects, the information for controlling the pulse width modulation setting may be provided by a pulse width modulation circuit. In some implementations, the pulse width modulation circuit comprises an amplifier circuit, the amplifier compares a voltage divided result of the first output voltage or the second output voltage against a reference voltage to generate an analog control signal, and/or the information for controlling the pulse width modulation setting comprises the analog control.

Method 1700 may proceed to operational block 1760 where the integrated resonant regulating rectifier 110, for example, may provide information for controlling the pulse frequency modulation setting, based on the pulse width modulation setting. In some aspects, the information for controlling the pulse frequency modulation setting may be provided by a pulse frequency modulation circuit. In various implementations, the information for controlling the pulse frequency modulation setting is determined by the pulse frequency modulation circuit based on the pulse width modulation setting. In some aspects, the pulse frequency modulation circuit comprises a clock generation circuit for providing the information for controlling the pulse frequency modulation as a digital signal, and/or the pulse frequency modulation circuit further comprises a bidirectional shift register for controlling the clock generation circuit.

Additionally or alternatively, the pulse frequency modulation circuit comprises a first latch circuit for determining whether the pulse width modulation setting is at an upper threshold, the pulse frequency modulation circuit further comprises a second latch circuit for determining whether the pulse width modulation setting is at a lower threshold, and/or the pulse frequency modulation circuit further comprises a latch enabler circuit to selectively enable the first and/or second latch circuits.

Additionally or alternatively, the method 1700 may be performed through a chip, where the resonant circuit comprises a loop coil antenna on the chip, and where a majority of (e.g., substantially all) wires on the chip other than the antenna do not form loops. Additionally or alternatively, method 1700 may control a current mode of a buck-boost circuit (e.g., on the chip) through a mode arbiter, where the buck-boost circuit regulates and rectifies the radio frequency input, and where the current mode comprises a boost mode, a buck mode, and a combined boost-buck mode. Additionally or alternatively, method 1700 may use a feedback circuit for controlling a boost circuit, where the feedback circuit modifies at least a portion of the first output voltage or the second output voltage through operational transconductance amplification and proportional integral derivative to generate a control signal for turning the boost circuit off and on.

Although some specific examples are disclosed herein, they are merely examples as other types of circuits and component values may be used as well including sizing of components, differences in the logic circuits implementing the control, differences in the waveforms implementing the timing of the modulators, and/or the like.

One or more aspects or features of the subject matter described herein can be realized in digital electronic circuitry, integrated circuitry, specially designed application specific integrated circuits (ASICs), field programmable gate arrays (FPGAs) computer hardware, firmware, software, and/or combinations thereof. These various aspects or features can include implementation in one or more computer programs that are executable and/or interpretable on a programmable system including at least one programmable processor, which can be special or general purpose, coupled to receive data and instructions from, and to transmit data and instructions to, a storage system, at least one input device, and at least one output device.

These computer programs, which can also be referred to as programs, software, software applications, applications, components, or code, include machine instructions for a programmable processor, and can be implemented in a high-level procedural and/or object-oriented programming language, and/or in assembly/machine language. As used herein, the term "machine-readable medium" refers to any computer program product, apparatus and/or device, such as for example magnetic discs, optical disks, memory, and Programmable Logic Devices (PLDs), used to provide machine instructions and/or data to a programmable processor, including a machine-readable medium that receives machine instructions as a machine-readable signal. The term "machine-readable signal" refers to any signal used to provide machine instructions and/or data to a programmable processor. The machine-readable medium can store such machine instructions non-transitorily, such as for example as would a non-transient solid-state memory or a magnetic hard drive or any equivalent storage medium. The machine-readable medium can alternatively, or additionally, store such machine instructions in a transient manner, such as for example, as would a processor cache or other random access memory associated with one or more physical processor cores.

To provide for interaction with a user, one or more aspects or features of the subject matter described herein can be implemented on a computer having a display device, such as for example a cathode ray tube (CRT) or a liquid crystal display (LCD) or a light emitting diode (LED) monitor for displaying information to the user and a keyboard and a pointing device, such as for example a mouse or a trackball, by which the user may provide input to the computer. Other kinds of devices can be used to provide for interaction with a user as well. For example, feedback provided to the user can be any form of sensory feedback, such as for example visual feedback, auditory feedback, or tactile feedback; and input from the user may be received in any form, including, but not limited to, acoustic, speech, or tactile input. Other possible input devices include, but are not limited to, touch screens or other touch-sensitive devices such as single or multi-point resistive or capacitive track pads, voice recognition hardware and software, optical scanners, optical pointers, digital image capture devices and associated interpretation software, and the like.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and subcombinations of the disclosed features and/or combinations and subcombinations of several further features disclosed above. In addition, the logic flows depicted in the accompanying figures and/or described herein do not necessarily require the particular order shown, or sequential order, to achieve desirable results. Other implementations may be within the scope of the following claims.

What is claimed is:

1. An apparatus comprising:
a resonant circuit configured to receive a radio frequency input from a wireless power transmitter and generate an in-phase voltage and an out-of-phase voltage;
a pulse generation circuit coupled to the resonant circuit, the pulse generator circuit configured to at least:
gate the in-phase voltage to provide a first output voltage, and
gate the out-of-phase voltage to provide a second output voltage, the gating of the in-phase voltage and the gating of the out-of-phase voltage controlled by a pulse width modulation setting and a pulse frequency modulation setting;
a pulse width modulation circuit configured to provide, to the pulse generating circuit, information for controlling the pulse width modulation setting; and
a pulse frequency modulation circuit configured to provide, to the pulse generating circuit, information for controlling the pulse frequency modulation setting, the information for controlling the pulse frequency modulation setting determined based on the pulse width modulation setting.

2. The apparatus of claim 1, wherein the pulse generation circuit comprises a first transistor operatively coupled to the in-phase voltage and a second transistor operatively coupled to the out-phase voltage.

3. The apparatus of claim 2, wherein the pulse generation circuit operates the first transistor based at least in part upon the pulse width modulation setting, the pulse frequency modulation setting, and the in-phase voltage, and wherein the pulse generation circuit operates the second transistor based at least in part upon the pulse width modulation setting, the pulse frequency modulation setting, and the out-phase voltage.

4. The apparatus of claim 1, wherein the pulse width modulation circuit comprises an amplifier circuit, wherein the amplifier compares a voltage divided result of the first output voltage or the second output voltage against a reference voltage to generate an analog control signal, and wherein the information for controlling the pulse width modulation setting comprises the analog control.

5. The apparatus of claim 1, wherein the first output voltage and the second output voltage occur sequentially in time and enable providing a source of power, and wherein the source of power comprises a low-voltage direct current that is regulated.

6. The apparatus of claim 1, wherein the pulse frequency modulation circuit comprises a clock generation circuit for providing the information for controlling the pulse frequency modulation as a digital signal, wherein the pulse frequency modulation circuit further comprises a bidirectional shift register for controlling the clock generation circuit.

7. The apparatus of claim 1, wherein the pulse frequency modulation circuit comprises a first latch circuit for determining whether the pulse width modulation setting is at an upper threshold, wherein the pulse frequency modulation circuit further comprises a second latch circuit for determining whether the pulse width modulation setting is at a lower threshold, and wherein the pulse frequency modulation circuit further comprises a latch enabler circuit to selectively enable the first and second latch circuits.

8. The apparatus of claim 1, wherein the pulse generation circuit comprises a comparator for comparing the in-phase voltage against the first output voltage or the second output voltage to generate a first signal for turning the pulse generation circuit on, and wherein the pulse generation circuit further comprises a latch circuit for comparing the first output voltage or the second output voltage against a ground signal to generate a second signal for turning the pulse generation circuit off.

9. The apparatus of claim 1, further comprising a chip, wherein the resonant circuit comprises a loop coil antenna on the chip, and wherein a majority of wires on the chip other than the antenna do not form loops.

10. The apparatus of claim 1, further comprising a mode arbiter which controls a current mode of a buck-boost circuit, wherein the buck-boost circuit regulates and rectifies the radio frequency input, and wherein the current mode comprises a boost mode, a buck mode, and a combined boost-buck mode.

11. The apparatus of claim 1, further comprising a feedback circuit for controlling a boost circuit, wherein the feedback circuit modifies at least a portion of the first output voltage or the second output voltage through operational transconductance amplification and proportional integral derivative to generate a control signal for turning the boost circuit off and on.

12. A method comprising:
receiving a radio frequency input from a wireless power transmitter;
generating an in-phase voltage and an out-of-phase voltage;
gating the in-phase voltage to provide a first output voltage, and
gating the out-of-phase voltage to provide a second output voltage, the gating of the in-phase voltage and the gating of the out-of-phase voltage controlled by a pulse width modulation setting and a pulse frequency modulation setting;
providing information for controlling the pulse width modulation setting; and
providing information for controlling the pulse frequency modulation setting, the information for controlling the pulse frequency modulation setting determined based on the pulse width modulation setting.

13. The method of claim 12, wherein the gating of the in-phase voltage and the gating of the out-of-phase voltage are controlled by a pulse generation circuit comprising a first transistor operatively coupled to the in-phase voltage and a second transistor operatively coupled to the out-phase voltage.

14. The method of claim 13, further comprising:
operating the first transistor based at least in part upon the pulse width modulation setting, the pulse frequency modulation setting, and the in-phase voltage; and
operating the second transistor based at least in part upon the pulse width modulation setting, the pulse frequency modulation setting, and the out-phase voltage.

15. The method of claim 12, wherein the information for controlling the pulse width modulation setting is determined by a pulse width modulation circuit comprising an amplifier circuit, wherein the amplifier compares a voltage divided result of the first output voltage or the second output voltage against a reference voltage to generate an analog control signal, wherein the information for controlling the pulse width modulation setting comprises the analog control, wherein the first output voltage and the second output voltage occur sequentially in time and enable providing a source of power, and wherein the source of power comprises a low-voltage direct current that is regulated.

16. The method of claim 12, wherein the information for controlling the pulse frequency modulation setting is determined by a pulse frequency modulation circuit comprising a clock generation circuit for providing the information for controlling the pulse frequency modulation as a digital signal, wherein the pulse frequency modulation circuit further comprises a bidirectional shift register for controlling the clock generation circuit.

17. The method of claim 12, further comprising:
determining whether the pulse width modulation setting is at an upper threshold;
determining whether the pulse width modulation setting is at a lower threshold;
comparing the in-phase voltage against the first output voltage or the second output voltage to generate a first signal for initiating the gating of the in-phase voltage and the gating of the out-of-phase voltage; and
comparing the first output voltage or the second output voltage against a ground signal to terminate the gating of the in-phase voltage and the gating of the out-of-phase voltage.

18. The method of claim 12, wherein the method is performed by a chip, wherein the radio frequency input is received by a loop coil antenna on the chip, and wherein a majority of wires on the chip other than the antenna do not form loops.

19. The method of claim 12, further comprising:
controlling a current mode of a buck-boost circuit, wherein the buck-boost circuit regulates and rectifies the radio frequency input, and wherein the current mode comprises a boost mode, a buck mode, and a combined boost-buck mode; and
modifying at least a portion of the output voltage or the second output voltage through operational transconductance amplification and proportional integral derivative to generate a control signal for boosting the radio frequency input.

20. A non-transitory computer-readable storage medium including instructions which when executed by at least one controller causes operations comprising:

receiving a radio frequency input from a wireless power transmitter;
generating an in-phase voltage and an out-of-phase voltage;
gating the in-phase voltage to provide a first output voltage, and
gating the out-of-phase voltage to provide a second output voltage, the gating of the in-phase voltage and the gating of the out-of-phase voltage controlled by a pulse width modulation setting and a pulse frequency modulation setting;
providing information for controlling the pulse width modulation setting; and
providing information for controlling the pulse frequency modulation setting, the information for controlling the pulse frequency modulation setting determined based on the pulse width modulation setting.

* * * * *